United States Patent
Lee et al.

(10) Patent No.: US 12,328,870 B2
(45) Date of Patent: Jun. 10, 2025

(54) SEMICONDUCTOR DEVICE

(71) Applicant: Samsung Electronics Co., Ltd., Suwon-si (KR)

(72) Inventors: Yanghee Lee, Incheon (KR); Jonghyuk Park, Hwaseong-si (KR); Jinwoo Bae, Yongin-si (KR); Boun Yoon, Seoul (KR); Ilyoung Yoon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 17/662,316

(22) Filed: May 6, 2022

(65) Prior Publication Data
US 2023/0030176 A1 Feb. 2, 2023

(30) Foreign Application Priority Data

Jul. 28, 2021 (KR) .................. 10-2021-0099257

(51) Int. Cl.
*H10B 12/00* (2023.01)

(52) U.S. Cl.
CPC ......... *H10B 12/50* (2023.02); *H10B 12/0335* (2023.02); *H10B 12/09* (2023.02); *H10B 12/315* (2023.02); *H10B 12/34* (2023.02)

(58) Field of Classification Search
None
See application file for complete search history.

(56) References Cited

U.S. PATENT DOCUMENTS

| | | | |
|---|---|---|---|
| 5,073,510 A * | 12/1991 | Kwon | H01L 21/76802 438/303 |
| 7,091,102 B2 | 8/2006 | Lim et al. | |
| 7,795,731 B2 | 9/2010 | Park et al. | |
| 8,415,674 B2 | 4/2013 | Lim et al. | |
| 8,987,907 B2 | 3/2015 | Kang et al. | |
| 9,991,126 B2 | 6/2018 | Park et al. | |
| 10,332,888 B2 | 6/2019 | Liu et al. | |
| 2002/0047153 A1 * | 4/2002 | Nakamura | H01L 21/76855 257/E21.507 |
| 2002/0113317 A1 | 8/2002 | Okushima | |

(Continued)

FOREIGN PATENT DOCUMENTS

| | | |
|---|---|---|
| CN | 109786381 B | 5/2021 |
| JP | 2015216174 A | 12/2015 |

(Continued)

*Primary Examiner* — Erik T. K. Peterson
*Assistant Examiner* — Christopher A. Schodde
(74) *Attorney, Agent, or Firm* — Myers Bigel, P.A.

(57) ABSTRACT

A semiconductor device may include a substrate including a cell region and a peripheral region, lower electrodes on the cell region of the substrate, a dielectric layer on surfaces of the lower electrodes, a silicon germanium layer on the dielectric layer, a metal plate pattern and a polishing stop layer pattern stacked on the silicon germanium layer, and upper contact plugs physically contacting an upper surface of the silicon germanium layer. The upper contact plugs may have an upper surface farther away from the substrate than an upper surface of the polishing stop layer pattern. The upper contact plugs may be spaced apart from the metal plate pattern and the polishing stop layer pattern.

18 Claims, 22 Drawing Sheets

(56) References Cited

U.S. PATENT DOCUMENTS

| | | | |
|---|---|---|---|
| 2005/0208718 A1* | 9/2005 | Lim | H01L 21/02178 |
| | | | 438/785 |
| 2007/0210409 A1* | 9/2007 | Won | H01L 28/60 |
| | | | 257/E27.048 |
| 2011/0117718 A1* | 5/2011 | Nakamura | H10B 12/318 |
| | | | 438/387 |
| 2011/0284991 A1* | 11/2011 | Hijioka | H10B 12/09 |
| | | | 257/532 |
| 2012/0012925 A1* | 1/2012 | Oh | H01L 29/4236 |
| | | | 257/E21.294 |
| 2012/0261747 A1 | 10/2012 | Park et al. | |
| 2013/0228837 A1* | 9/2013 | Sukekawa | H10B 12/09 |
| | | | 257/532 |
| 2015/0102461 A1* | 4/2015 | Lee | H10B 12/09 |
| | | | 257/532 |
| 2016/0190198 A1* | 6/2016 | Kwon | H01L 27/1464 |
| | | | 257/435 |
| 2018/0166529 A1 | 6/2018 | Park et al. | |
| 2019/0206724 A1* | 7/2019 | Chang | H01L 21/76834 |
| 2021/0210492 A1* | 7/2021 | Han | H10B 12/50 |

FOREIGN PATENT DOCUMENTS

| | | | |
|---|---|---|---|
| JP | 2020092153 A | 6/2020 | |
| TW | I464807 B | 12/2014 | |

\* cited by examiner

SEMICONDUCTOR DEVICE

CROSS-REFERENCE TO RELATED APPLICATION

This application claims priority under 35 USC § 119 to Korean Patent Application No. 10-2021-0099257, filed on Jul. 28, 2021, in the Korean Intellectual Property Office (KIPO), the contents of which are incorporated by reference herein in their entirety.

BACKGROUND

1. Field

Example embodiments relate to a semiconductor device. Some example embodiments relate to reducing defects in a DRAM (dynamic random access memory) device.

2. Description of the Related Art

In recent highly integrated DRAM devices, refresh failures may occur due to defects, such as cracks and dangling bonds, included in a surface of a substrate and a capacitor. Thus, reducing defects in the surface of the substrate and the capacitor may be desirable.

SUMMARY

Example embodiments provide a semiconductor device having improved electrical characteristics.

According to example embodiments, there is provided a semiconductor device. The semiconductor device may include a substrate including a cell region and a peripheral region, lower electrodes on the cell region of the substrate, a dielectric layer on surfaces of the lower electrodes, a silicon germanium layer on the dielectric layer, a metal plate pattern and a polishing stop layer pattern stacked on the silicon germanium layer, and upper contact plugs physically contacting an upper surface of the silicon germanium layer. The upper contact plugs may have an upper surface farther away from the substrate than an upper surface of the polishing stop layer pattern. The upper contact plugs may be spaced apart from the metal plate pattern and the polishing stop layer pattern.

According to example embodiments, there is provided a semiconductor device. The semiconductor device may include a substrate including a cell region and a peripheral region, lower electrodes on the cell region of the substrate, a dielectric layer on surfaces of the lower electrodes, a silicon germanium layer on the dielectric layer, a metal plate pattern and a polishing stop layer pattern stacked on the silicon germanium layer. The silicon germanium layer may include an upper surface positioned on the cell region and a vertical surface positioned at a boundary between the cell region and the peripheral region. The metal plate pattern may include openings at least partially exposing an upper surface of the silicon germanium layer on the cell region. Filling insulation patterns may be in the openings, respectively.

According to example embodiments, there is provided a semiconductor device. The semiconductor device may include a substrate including a cell region and a peripheral region, a cell lower structure including bit line structures, contact plugs, and landing pads on the cell region of the substrate, lower electrodes on the landing pads, respectively, a dielectric layer on surfaces of the lower electrodes, a metal containing layer on the dielectric layer, a silicon germanium layer on the metal containing layer, a stacked structure including the metal plate pattern and a polishing stop layer pattern on the silicon germanium layer. The stacked structure may include openings at least partially exposing an upper surface of the silicon germanium layer on the cell region. Filling insulation patterns may be in the openings, respectively. An insulating interlayer may be on the polishing stop layer pattern, the filling insulation patterns, and a peripheral region, and upper contact plugs may extend through the insulating interlayer and the filling insulation patterns. The insulating interlayer may have a flat upper surface. The upper contact plugs may physically contact an upper surface of the silicon germanium layer.

In the semiconductor device to example embodiments, because lower sidewalls of the upper contact plugs may not directly contact the polishing stop layer and the metal plate layer, hydrogen ions transferred through the upper contact plugs may not be trapped into the polishing stop layer pattern and the metal plate pattern. The hydrogen ions may, therefore, move downwards. The movement of the hydrogen ions may improve the reliability of the semiconductor device.

BRIEF DESCRIPTION OF THE DRAWINGS

Example embodiments will be more clearly understood from the following detailed description taken in conjunction with the accompanying drawings.

FIG. 1 is a plan view illustrating a layout of a DRAM device in accordance with example embodiments;

FIG. 2 is a cross-sectional view of a DRAM device in accordance with example embodiments;

FIG. 3 is a plan view illustrating positions of first openings of a polishing stop layer pattern and positions of upper contact plugs in a DRAM device in accordance with example embodiments;

FIG. 4 is a plan view illustrating positions of first openings of a polishing stop layer pattern and positions of upper contact plugs in a DRAM device in accordance with example embodiments;

FIG. 5 is a cross-sectional view of a DRAM device in accordance with example embodiments;

FIG. 6 is a plan view illustrating positions of first openings of a polishing stop layer pattern and positions of upper contact plugs in a DRAM device in accordance with example embodiments;

FIGS. 7 to 15 and 19 to 21 are cross-sectional views illustrating a method of manufacturing a DRAM device in accordance with example embodiments;

FIG. 16 is a plan view illustrating positions of first openings of a polishing stop layer pattern in a DRAM device in accordance with example embodiments;

FIG. 17 is a plan view illustrating positions of first openings of a polishing stop layer pattern in a DRAM device in accordance with example embodiments;

FIG. 18 is a plan view illustrating positions of first openings of a polishing stop layer pattern in a DRAM device in accordance with example embodiments; and FIGS. 22 to 24 are cross-sectional views illustrating a method of manufacturing a DRAM device in accordance with example embodiments.

DESCRIPTION OF EMBODIMENTS

Figure 1:
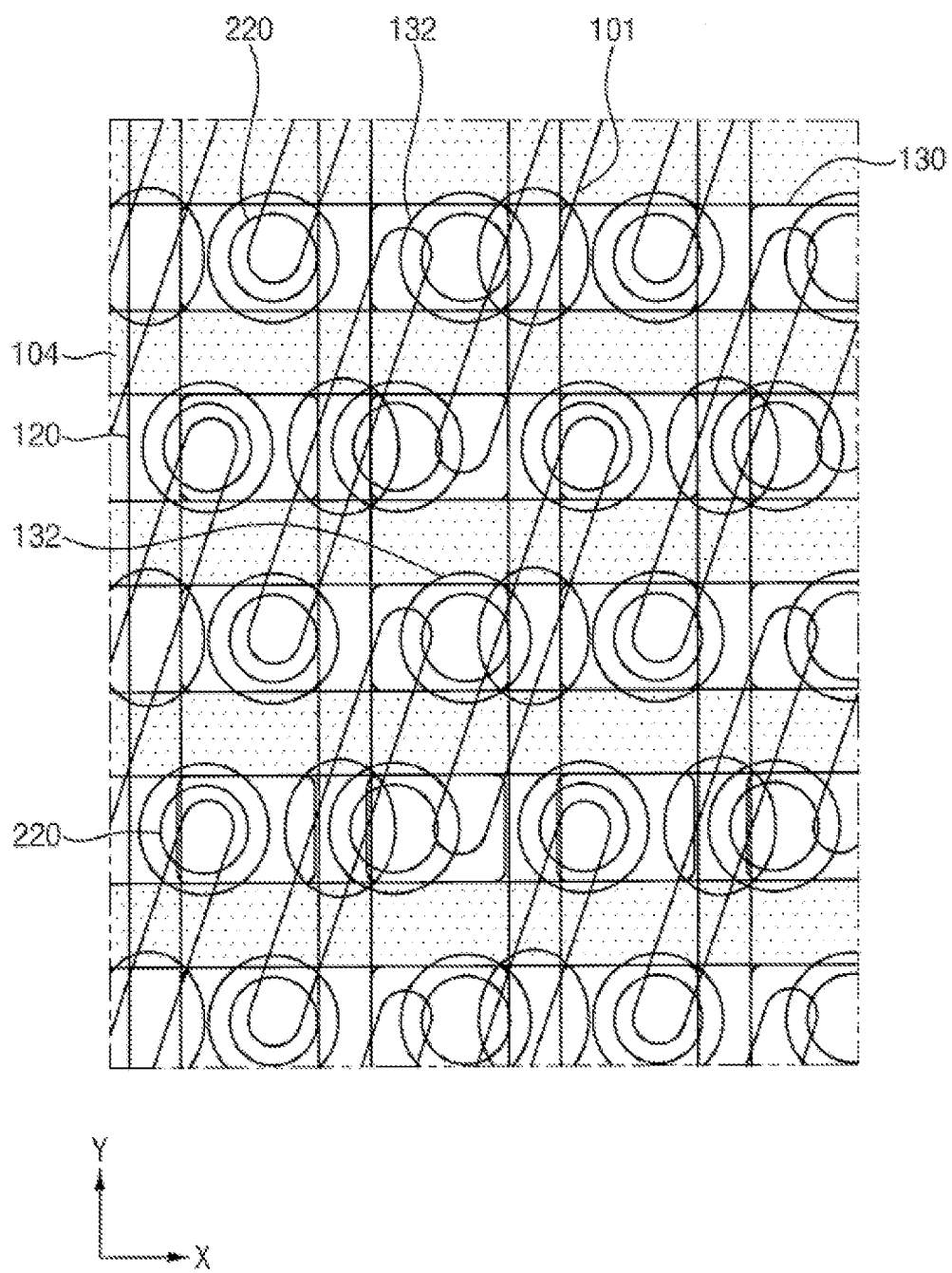
FIGS. 1 to 24 represent non-limiting, example embodiments as described herein.
Figure 2:
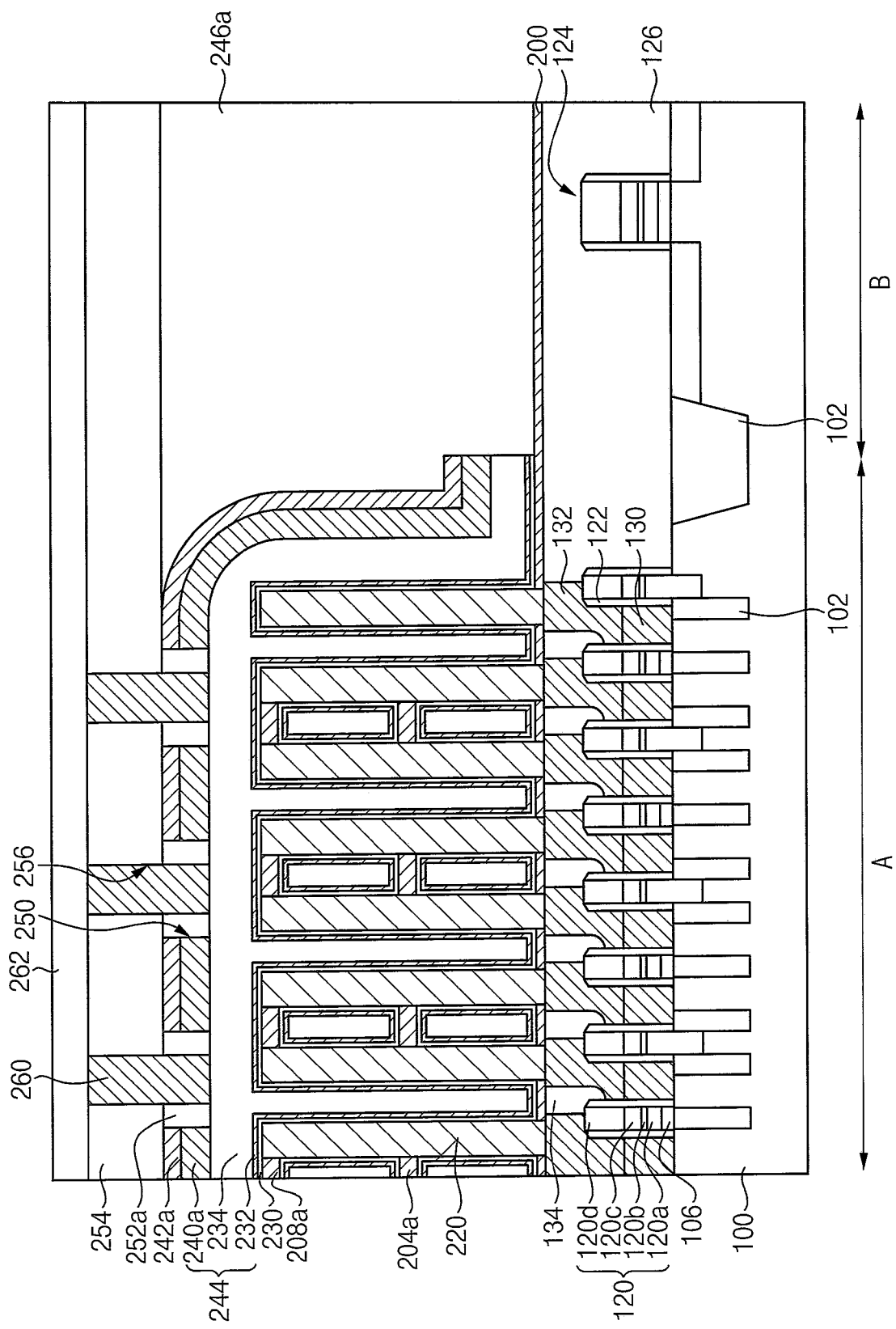
Figure 3:
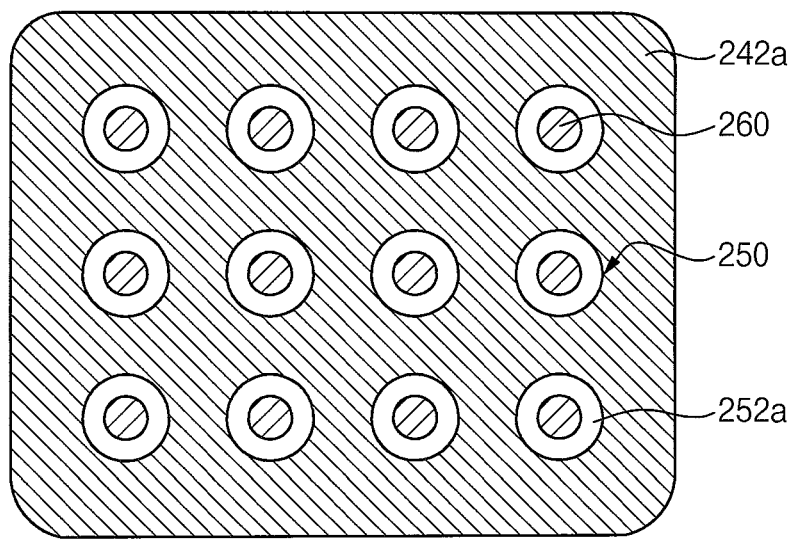
Figure 4:
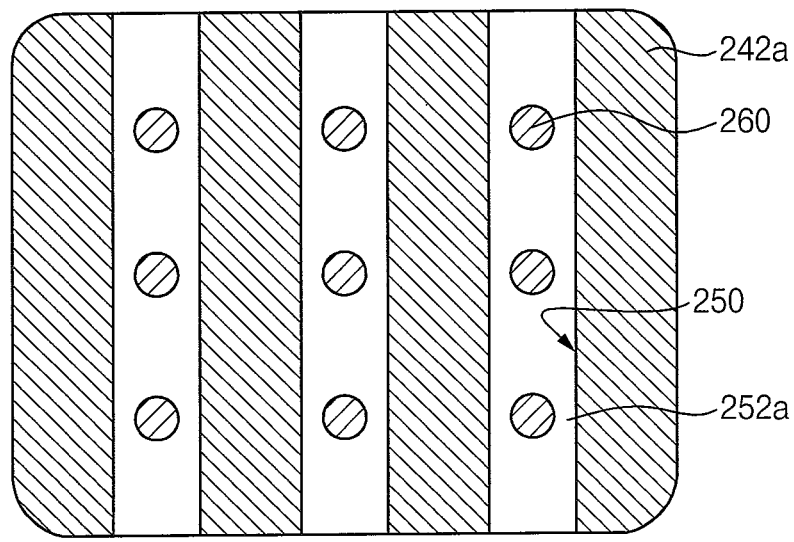

Hereinafter, embodiments of the inventive concept will be described in detail with reference to the accompanying drawings. Identical reference numerals are used for the same constituent elements in the drawings, and duplicate descriptions thereof are omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. FIG. 1 is a plan view illustrating a layout of a DRAM device in accordance with example embodiments. FIG. 2 is a cross-sectional view of a DRAM device in accordance with example embodiments. FIG. 3 is a plan view illustrating positions of first openings of a polishing stop layer pattern and positions of upper contact plugs in a DRAM device in accordance with example embodiments. FIG. 4 is a plan view illustrating positions of first openings of a polishing stop layer pattern and positions of upper contact plugs in a DRAM device in accordance with example embodiments.

To reduce the complexity of the drawing, structures formed on a lower electrode of a cell capacitor are not shown in FIG. 1.

Referring to FIGS. 1 and 2, a DRAM device may be formed on a substrate 100 including a cell region A and a peripheral region B.

A lower structure may be formed on the cell region A of the substrate 100. The lower structure may include, e.g., a selection transistor, a bit line structure 120, a contact plug 130, a landing pad 132, and an upper insulation pattern 134. A capacitor and an upper contact plug 260 may be formed on the lower structure. A transistor 124 for a peripheral circuit may be formed on the peripheral region B of the substrate 100.

The substrate 100 may be a wafer including silicon, germanium, silicon-germanium, or a III-V compound such as GaP, GaAs, and/or GaSb. In some example embodiments, the substrate 100 may be a silicon-on-insulator (SOI) wafer or a germanium-on-insulator (GOI) wafer.

An isolation layer 102 may be formed on the substrate 100. The substrate 100 between the isolation layers 102 may be defined as an active region 101.

A gate trench extending in a first direction X parallel to an upper surface of the substrate 100 may be formed at the substrate 100 in the cell region. A gate structure 104 may be formed in the gate trench.

In example embodiments, the gate structure 104 may include a gate insulation layer, a gate electrode, and a capping insulation pattern. A plurality of the gate structures 104 may be arranged in a second direction Y perpendicular to the first direction X and parallel to the upper surface of the substrate 100.

First and second impurity regions serving as source/drain regions may be formed at an upper portion of the active region between the gate structures 104. The gate structure 104 and the first and second impurity regions may serve as the selection transistor.

An insulation layer pattern 106 may be formed on the active region, the isolation layer 102, and the gate structure 104. A recess may be included in a portion of the substrate 100 on which the insulation layer pattern 106 is not formed. At least a portion of an upper surface of the first impurity region may be exposed by a bottom of the recess.

A bit line structure 120 may be formed on the insulation layer pattern 106 and the recess. The bit line structure 120 may be formed on the cell region A of the substrate 100.

The bit line structure 120 may include a conductive pattern 120*a*, a barrier metal pattern 120*b*, a metal pattern 120*c*, and a hard mask pattern 120*d*, which may be sequentially stacked. The conductive pattern 120*a* may include, e.g., polysilicon doped with impurities. The bit line structure 120 may extend in the second direction Y. A plurality of the bit line structures may be arranged in the first direction X to be spaced apart from each other. In example embodiments, a spacer 122 may be formed on a sidewall of the bit line structure 120.

The transistor 124 for a peripheral circuit may be formed on the peripheral region B of the substrate 100.

A first insulating interlayer 126 may be in and at least partially fill a space between the bit line structures 120, and may be on and at least partially cover the transistor 124 for the peripheral circuit.

A stacked structure including the contact plug 130 and the landing pad 132 may pass through the first insulating interlayer 126 and the insulation layer pattern 106 on the cell region A, and the stacked structure may physically contact the second impurity region. The contact plug 130 may be disposed between the bit line structures 120. The landing pad 132 may be formed on the contact plug 130. An upper insulation pattern 134 may be formed between the landing pads 132.

An etch stop layer 200 may be formed on the landing pad 132, the upper insulation pattern 134, and the first insulating interlayer 126. A cell capacitor may physically contact the landing pad 132 through the etch stop layer 200.

The cell capacitor may include a lower electrode 220, a dielectric layer 230, and an upper electrode 244. The cell capacitor may further include a lower support layer pattern 204*a* and an upper support layer pattern 208*a*.

The lower electrode 220 may be formed on an upper surface of the landing pad 132 through the etch stop layer 200.

In example embodiments, the lower electrode 220 may have a filled cylindrical shape, that is, a pillar shape. In some example embodiments, the lower electrode may have a hollow cylindrical shape.

In example embodiments, the lower electrode 220 may include a metal, such as Ti, W, Ni, and/or Co, or a metal nitride, such as TiN, TiSiN, TiAlN, TaN, TaSiN, and/or WN. For example, the lower electrode 220 may include TiN.

Each of the lower support layer pattern 204*a* and the upper support layer pattern 208*a* may be disposed between the lower electrodes 220. Each of the lower support layer pattern 204*a* and the upper support layer pattern 208*a* may connect to the lower electrodes 220, and thus the lower electrodes 220 may be supported by the lower support layer pattern 204*a* and the upper support layer pattern 208*a*. The lower support layer pattern 204*a* and the upper support layer pattern 208*a* may include an insulation material, e.g., silicon nitride and/or silicon oxynitride.

In some example embodiments, at least one of the upper support layer pattern and the lower support layer pattern may not be formed. In some example embodiments, two or more first lower support layer patterns may be formed under the upper support layer pattern.

The dielectric layer 230 may be conformally formed on surfaces of the lower electrode 220, the lower support layer pattern 204a, the upper support layer pattern 208a, and the etch stop layer 200. The dielectric layer 230 may include a high-k layer. In example embodiments, the high-k layer may include, e.g., a hafnium oxide layer (HfO2), a zirconium oxide layer (ZrO2), an aluminum oxide layer (Al2O3), or a lanthanum oxide layer (La2O5).

A metal-containing layer 232 may be formed on the dielectric layer 230. In example embodiments, the metal-containing layer 232 may include a metal nitride. The metal nitride includes, e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN).

In example embodiments, the metal-containing layer 232 may be conformally formed on the dielectric layer 230, and may not completely fill a space between the lower electrodes 220. In some example embodiments, the metal-containing layer 232 may at least partially fill a space between the lower electrodes 220.

A silicon germanium layer 234 may be formed on the metal-containing layer 232.

In example embodiments, the silicon germanium layer 234 may have a thickness less than 2000 Å in a vertical direction from a lower layer (i.e., a direction generally perpendicular to a plane defined by the substrate 100). For example, the silicon germanium layer 234 may have a thickness of about 800 Å to about 1500 Å.

The dielectric layer 230, the metal-containing layer 232, and the silicon germanium layer 234 may be formed only on the cell region A of the substrate 100. That is, the dielectric layer 230, the metal-containing layer 232, and the silicon germanium layer 234 may not be formed on the peripheral region B of the substrate 100.

Due to a step difference between the cell region A and the peripheral region B, the silicon germanium layer 234 may include a flat upper surface and a vertical surface. That is, the silicon germanium layer 234 positioned on the lower electrode 220 of the cell region may have the flat upper surface. The silicon germanium layer 234 positioned at a boundary between the cell region A and the peripheral region B may have the vertical surface perpendicular to the surface of the substrate 100.

A metal plate pattern 240a and a polishing stop layer pattern 242a may be stacked on the silicon germanium layer 234. First openings 250 may be included in a stacked structure including the metal plate pattern 240a and the polishing stop layer pattern 242a. The first openings 250 may expose the flat upper surface of the silicon germanium layer 234.

The metal plate pattern 240a may include tungsten. In example embodiments, the metal plate pattern 240a may have a thickness less than a thickness of the silicon germanium layer 234 in a direction generally perpendicular to the substrate 100. For example, the thickness of the metal plate pattern 240a may be less than 70% of the thickness of the silicon germanium layer 234.

In example embodiments, the polishing stop layer pattern 242a may include silicon oxynitride, silicon nitride, SiCN, or the like.

The metal-containing layer 232, the silicon germanium layer 234, and the metal plate pattern 240a may serve as the upper electrode 244.

A filling insulation pattern 252a may be formed in the first opening 250. The filling insulation pattern 252a may include silicon oxide. For example, the filling insulation pattern 252a may include a tetraethyl orthosilicate (TEOS) material.

As shown in FIG. 3, each of the first openings 250 may have a hole shape, in a plan view. In this case, each of the filling insulation pattern elements 252a may have a pillar shape.

As shown in FIG. 4, each of the first openings 250 may have a line shape, in a plan view. In this case, each of the filling insulation pattern elements 252a may have a line shape.

A second insulating interlayer pattern 246a may be formed on the peripheral region B of the substrate 100.

Upper surfaces of the polishing stop layer pattern 242a, the filling insulation pattern 252a, and the second insulating interlayer pattern 246a may be substantially coplanar with each other.

A third insulating interlayer 254 may be formed to be on and at least partially cover the polishing stop layer pattern 242a, the filling insulation pattern 252a, and the second insulating interlayer pattern 246a.

An upper contact plug 260 may extend through the third insulating interlayer 254 and the filling insulation pattern 252a, and the upper contact plug may physically contact the silicon germanium layer 234. An upper surface of the upper contact plug 260 may be higher or farther away from the substrate 100 than an upper surface of the polishing stop layer pattern 242a.

The upper contact plug 260 may be electrically connected to the upper electrode 244 of the cell capacitor. The upper contact plug 260 may include a metal. In example embodiments, the upper contact plug 260 may include tungsten.

A bottom of the upper contact plug 260 may physically contact the upper surface of the silicon germanium layer 234. Also, a sidewall of the upper contact plug 260 may physically contact the third insulating interlayer 254 and the filling insulation pattern 252a including silicon oxide. The upper contact plugs 260 may not physically contact the polishing stop layer pattern 242a and the metal plate pattern 240a.

In example embodiments, as shown in FIG. 3, one upper contact plug 260 may be formed in one first opening 250 having the hole shape, respectively. The first openings 250 are disposed to overlap with portions for forming the upper contact plugs 260, respectively, and thus a horizontal area of each of the first openings 250 may be greater than a horizontal area of each of the upper contact plugs 260 as shown in FIGS. 3 and 4. In some example embodiments, although not shown, upper contact plugs may be formed in some of the first openings, and upper contact plugs may not be formed in remaining ones of the first openings.

In example embodiments, as shown in FIG. 4, at least one upper contact plug 260 may be formed in the first opening 250 having the line shape.

A fourth insulating interlayer 262 may be on and at least partially cover the third insulating interlayer 254 and the upper surfaces of the upper contact plugs 260.

In manufacturing of the DRAM device, hydrogen ions may be introduced to reduce or remove dangling bonds, trap sites, or cracks included in the capacitor, the active region of the substrate 100, and the gate insulation layer. Thus, the capacitor and structures positioned thereon may be designed to facilitate downward movement of the hydrogen ions.

The hydrogen ions may move downward through the upper contact plug 260. Lower sidewalls of the upper contact plugs 260 may physically contact the filling insulation pattern 252a including silicon oxide. The lower sidewalls of the upper contact plugs 260 may not physically contact the polishing stop layer pattern 242a and the metal plate pattern 240a. Therefore, hydrogen ions transferred through the upper contact plugs 260 may not be trapped into the polishing stop layer pattern 242a and the metal plate pattern 240a, and may move downward. Accordingly, dangling bonds, trap sites, or cracks included in the capacitor, the active region of the substrate 100 or the gate insulation layer may be reduced or removed by the hydrogen ions, and the defects may be cured.

If the filling insulation pattern is not formed and the lower sidewalls of the upper contact plugs directly contact the polishing stop layer and the metal plate layer, the hydrogen ions transferred through the upper contact plug may be trapped into the polishing stop layer pattern and the metal plate layer. Thus, the hydrogen ions may not move downward. In this case, because the hydrogen ions are not introduced into the capacitor, the active region of the substrate, or the gate insulation layer, the defects may not be cured.

As described above, in the DRAM device according to some embodiments of the inventive concept, the defects may be cured by the hydrogen ions, so that device failures may be reduced and reliability may be improved.

Figure 5:
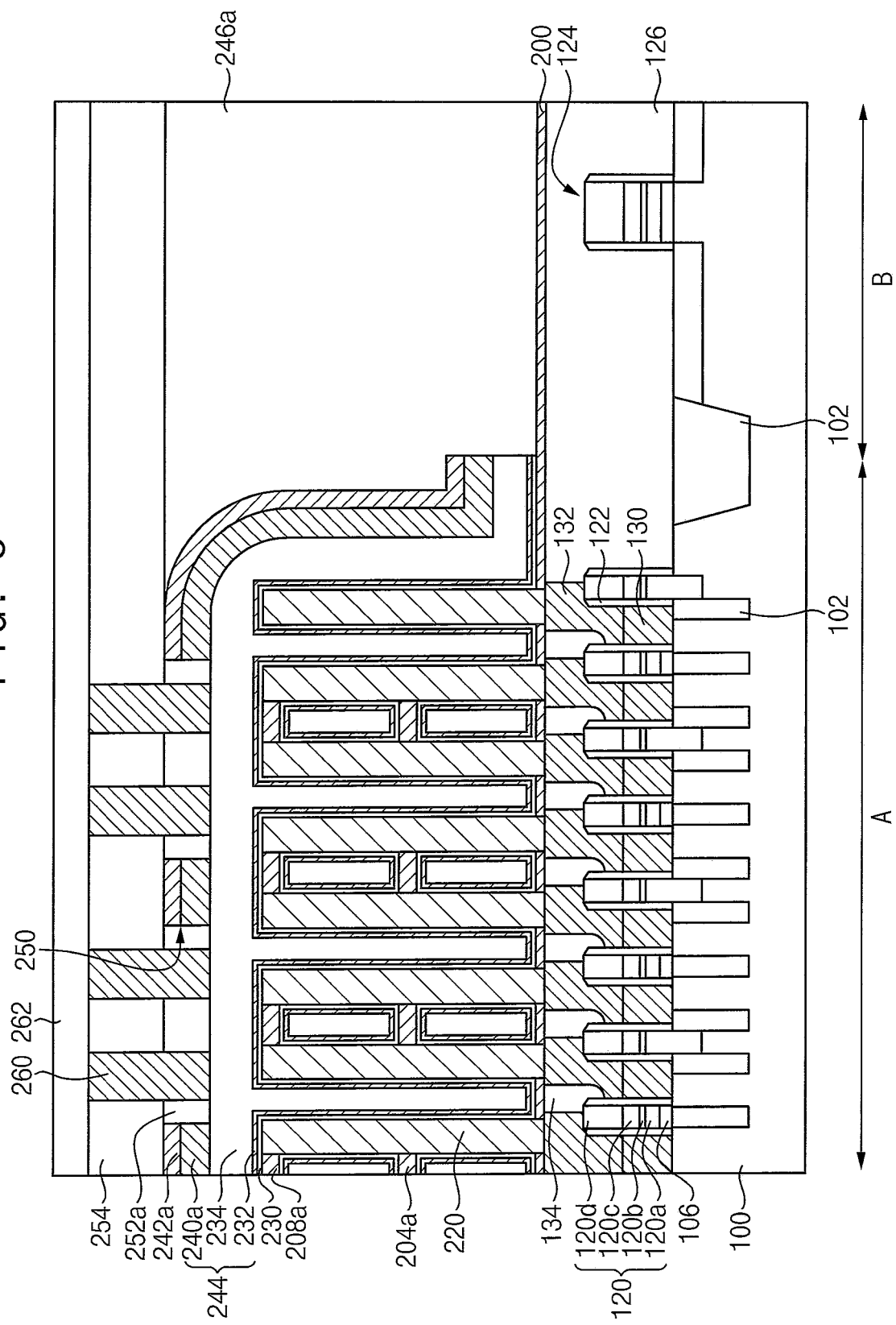
Figure 6:
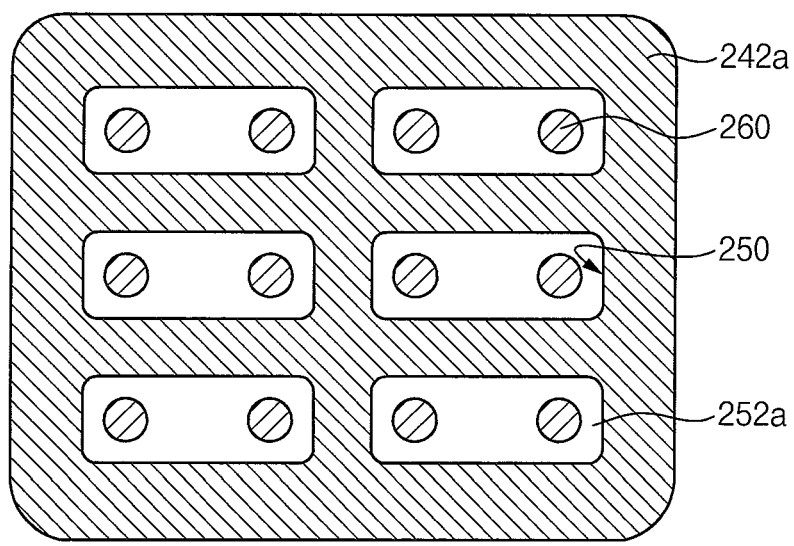

FIG. 5 is a cross-sectional view of a DRAM device in accordance with example embodiments. FIG. 6 is a plan view illustrating positions of first openings of a polishing stop layer pattern and positions of upper contact plugs in a DRAM device in accordance with example embodiments.

The DRAM device shown in FIGS. 5 and 6 is the same as the DRAM device illustrated with reference to FIG. 2, except for a shape of first openings of a polishing stop layer pattern and a position of an upper contact plug, and thus duplicate descriptions may be omitted.

Referring to FIGS. 5 and 6, the first openings 250 may be formed in the stacked structure including the metal plate pattern 240a and the polishing stop layer pattern 242a.

As shown in FIG. 6, in a plan view, each of the first openings 250 may have a rectangular shape extending in one direction.

In example embodiments, as shown in FIG. 6, a plurality of upper contact plugs 260 may be formed in each of the first openings 250 having a rectangular shape. A plurality of upper contact plugs 260 may be spaced apart from each other.

FIGS. 7 to 15 and 19 to 21 are cross-sectional views illustrating a method of manufacturing a DRAM device in accordance with example embodiments.

Figure 16:
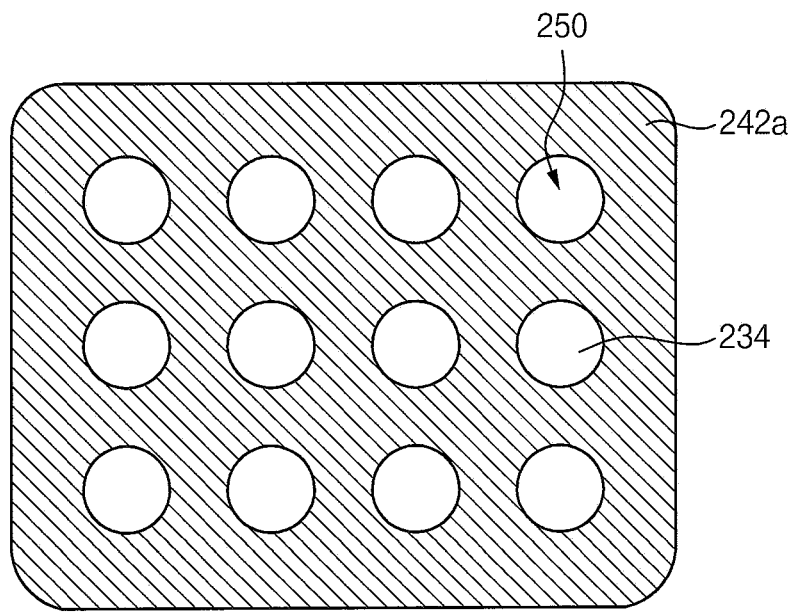
Figure 17:
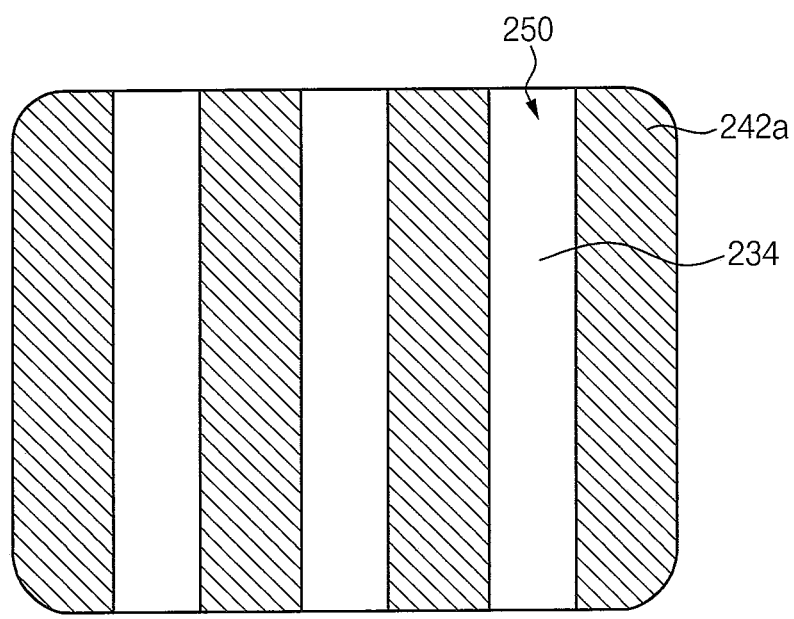
Figure 18:
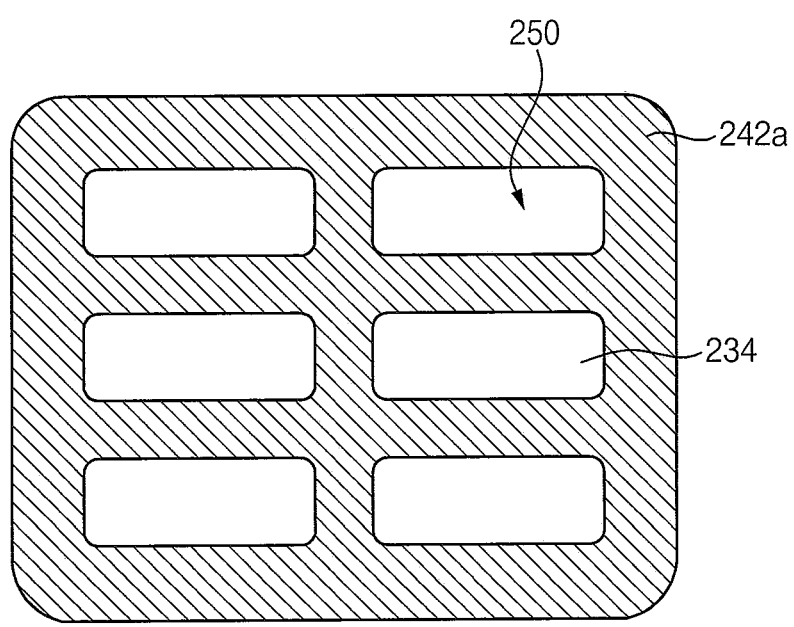

FIG. 16 is a plan view illustrating positions of first openings of a polishing stop layer pattern in a DRAM device in accordance with example embodiments. FIG. 17 is a plan view illustrating positions of first openings of a polishing stop layer pattern in a DRAM device in accordance with example embodiments. FIG. 18 is a plan view illustrating positions of first openings of a polishing stop layer pattern in a DRAM device in accordance with example embodiments.

Figure 7:
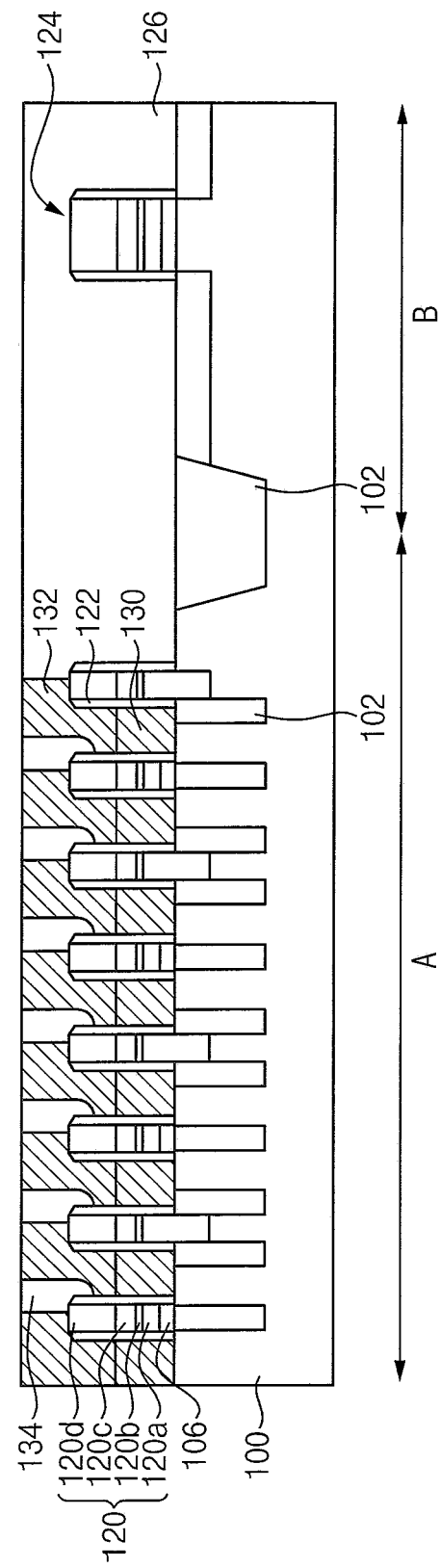

Referring to FIG. 7, an isolation layer 102 defining an active region may be formed on a substrate 100 including a cell region A and a peripheral circuit region B.

A lower structure may be formed on the cell region A of the substrate 100. The lower structure may include, e.g., a transistor, a bit line structure 120, a contact plug 130, a landing pad 132, and an upper insulation pattern 134. Upper surfaces of the landing pad 132 and the upper insulation pattern 134 may be at least partially exposed at an uppermost surface of the lower structure. When the lower structure is formed on the cell region A, a transistor 124 for a peripheral circuit may be formed on the peripheral circuit region together.

Particularly, the isolation layer 102 may be formed by performing a trench isolation process on the substrate 100. Transistors may be formed on the cell region A of the substrate 100. Each of the transistors may include a gate structure (not shown) and first and second impurity regions. In example embodiments, the transistor may be a buried channel transistor. In example embodiments, a portion of the substrate 100 may be etched to form a gate trench, and the gate structure may be formed in the gate trench. For example, the gate structure may include a gate insulation layer, a gate electrode, and a capping pattern, which are stacked sequentially.

An insulation layer pattern 106 may be formed on the substrate 100. A recess may be formed in the substrate 100 between the insulation layer patterns 106. An upper surface of the first impurity region (not shown) may be exposed by a bottom of the recess.

Bit line structures 120 may be formed on the insulation layer pattern 106 and the recess in the cell region A. The bit line structure 120 may include a conductive pattern 120a, a barrier metal pattern 120b, a metal pattern 120c, and a hard mask pattern 120d, which are sequentially stacked. In example embodiments, a spacer 122 may be formed on a sidewall of the bit line structure 120.

In the process for forming the bit line structures 120, a transistor 124 for a peripheral circuit may also be formed on the peripheral circuit region B of the substrate 100.

A first insulating interlayer 126 may be formed on the substrate 100 to be on and at least partially cover the bit line structures 120 and the transistor 124 for a peripheral circuit.

A portion of the first insulating interlayer 126 between the bit line structures 120 may be etched to form a lower contact hole at least partially exposing the second impurity region of the substrate 100. The contact plug 130 and the landing pad 132 may be formed to be in and at least partially fill the lower contact hole. The upper insulation pattern 134 may be formed between the landing pads 132.

In example embodiments, upper surfaces of the landing pad 132 and the upper insulation pattern 134 in the cell region and an upper surface of the first insulating interlayer 126 in the peripheral circuit region may be coplanar with each other. The upper surfaces of the landing pad 132 and the upper insulation pattern 134 in the cell region A and the upper surface of the first insulating interlayer 126 in the peripheral circuit region B may be generally flat.

Figure 8:
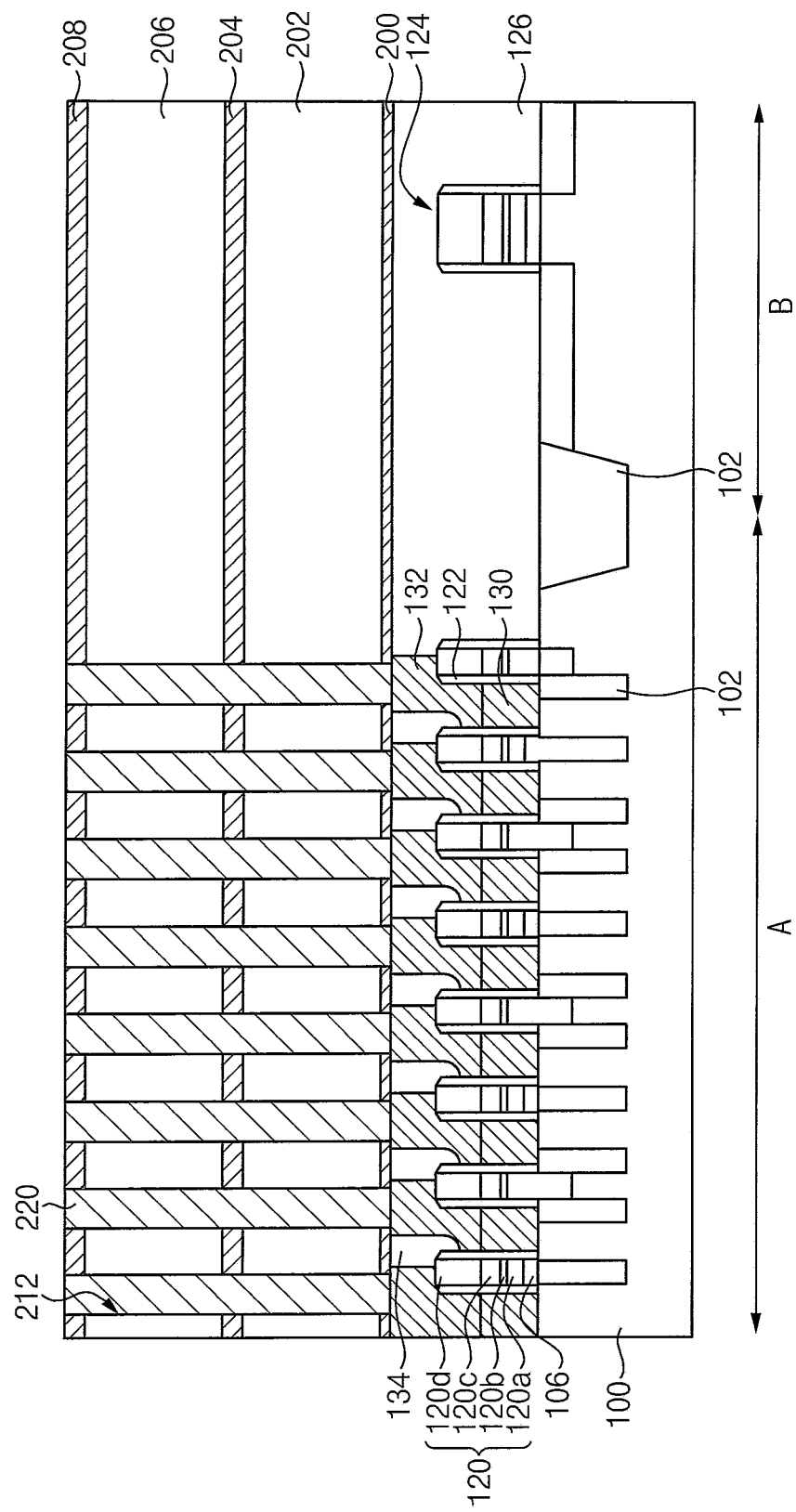

Referring to FIG. 8, an etch stop layer 200 may be formed on the first insulating interlayer 126, the landing pad 132, and the upper insulation pattern 134. The etch stop layer 200 may include, e.g., silicon nitride, silicon oxynitride, or the like.

A first mold layer 202, a lower support layer 204, a second mold layer 206, and an upper support layer 208 may be sequentially formed on the etch stop layer 200.

The first and second mold layers 202 and 206 may include a material having an etch selectivity with respect to the lower support layer 204 and the upper support layer 208. For example, the first mold layer 202 and the second mold layer 206 may include silicon oxide, and the lower support layer 204 and the upper support layer 208 may include silicon nitride.

In the present embodiment, two support layers may be formed in the mold layers. However, depending on a structure of a capacitor, a single support layer or three or more support layers may be formed in the mold layers. In some example embodiments, the support layer may not be formed, and one mold layer may be formed on the etch stop layer.

An etch mask (not shown) may be formed on the upper support layer 208. The upper support layer 208, the second mold layer 206, the lower support layer 204, the first mold layer 202, and the etch stop layer 200 may be etched using the etching mask to form first holes 212. The etching process may include an anisotropic etching process. The first holes 212 may at least partially expose the upper surfaces of the landing pads 132 on the cell region A of the substrate, respectively.

Thereafter, a lower electrode layer may be formed to be in and at least partially fill in the first holes 212. The lower electrode layer may be planarized until an upper surface of the upper support layer 208 may be at least partially exposed to form lower electrodes 220 at least partially filling the first holes 212. In this case, the lower electrodes 220 may have a pillar shape. The lower electrode may include a metal, such as Ti, W, Ni, and/or Co or a metal nitride, such as TiN, TiSiN, TiAlN, TaN, TaSiN, and/or WN.

Figure 9:
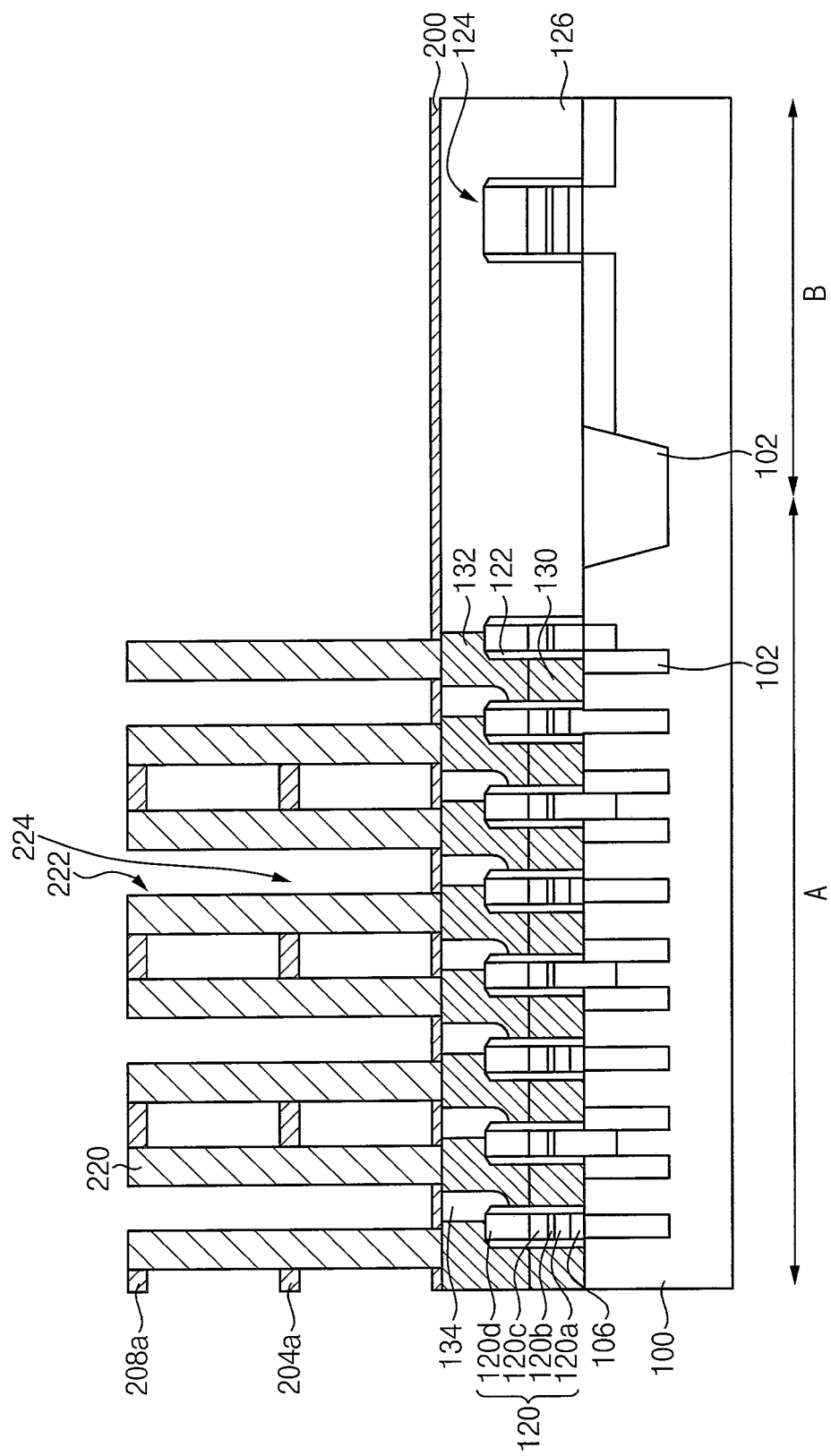

Referring to FIG. 9, a first mask pattern (not shown) may be formed on the upper support layer 208 and the lower electrode 220. The first mask pattern may include amorphous carbon and/or polysilicon. The first mask pattern may include holes.

The upper support layer 208 may be anisotropically etched using the first mask pattern to form second holes 222 exposing an upper portion of the second mold layer 206. Accordingly, an upper support layer pattern 208a may be formed on the cell region A of the substrate 100. Thereafter, the second mold layer 206 may be wet etched using etchant supplied through the second holes 222. Accordingly, the lower support layer 204 and upper sidewalls of the lower electrodes 220 may be at least partially exposed.

Thereafter, a portion of the lower support layer 204 may be etched to form third holes 224 at least partially exposing an upper portion of the first mold layer 202. Accordingly, a lower support layer pattern 204a may be formed on the cell region A of the substrate 100. The first mold layer 202 may be wet etched using etchant supplied through the third holes 224.

Each of the upper support layer pattern 208a and the lower support layer pattern 204a may physically contact outer sidewalls of the lower electrodes 220, and may be connected to the sidewalls of the lower electrodes 220. Thus, the sidewalls of the lower electrode 220 may be supported by the upper support layer pattern 208a and the lower support layer pattern 204a, so that the lower electrode 220 may not lean to one side. Also, a surface of the lower electrode 220 may be exposed.

Figure 10:
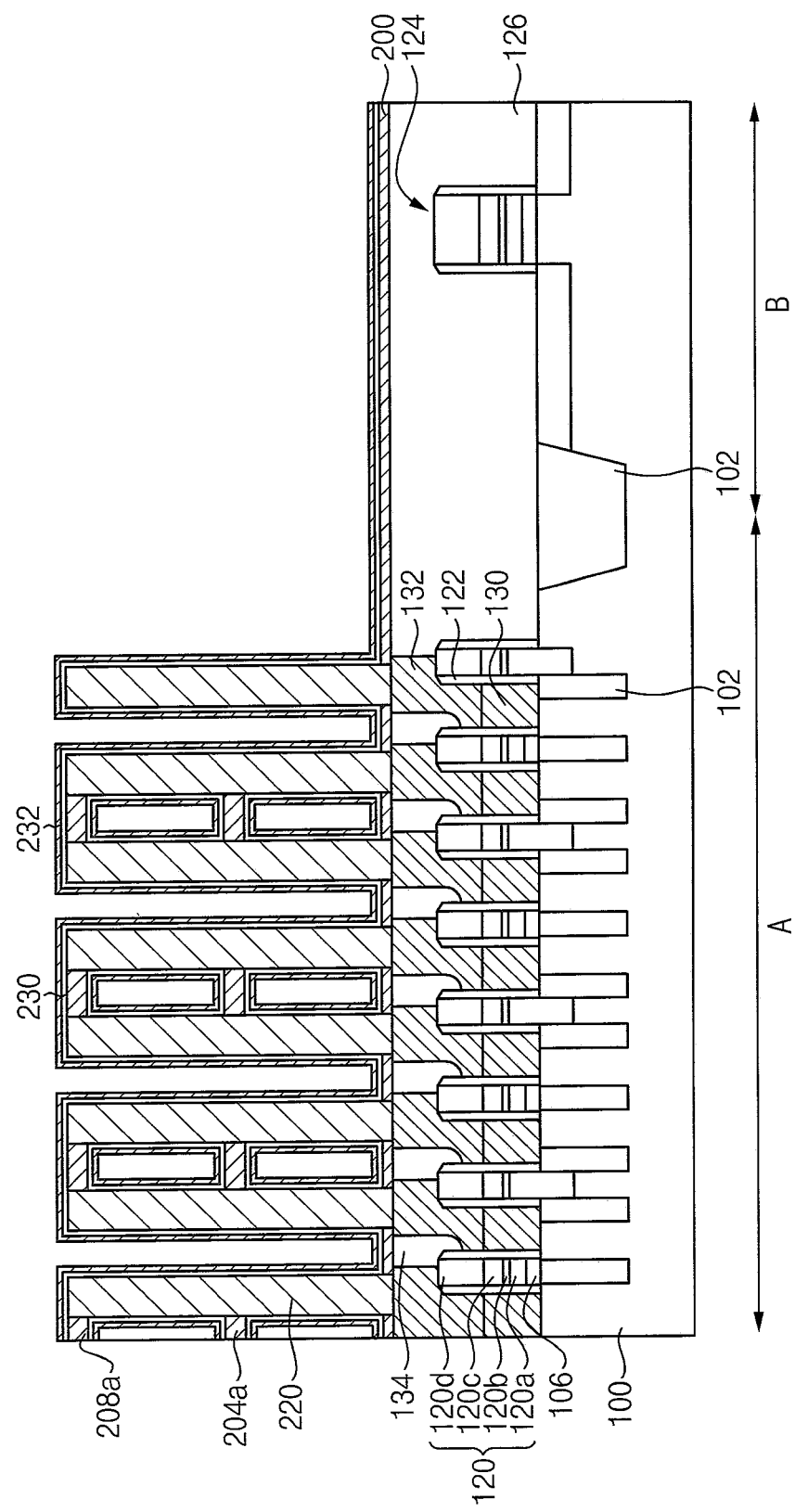

Referring to FIG. 10, a dielectric layer 230 may be conformally formed on surfaces of the lower electrode 220, the lower and upper support layer patterns 204a and 208a, and the etch stop layer 200.

The dielectric layer 230 may include a high-k layer. In example embodiments, the high-k layer may include a hafnium oxide layer (HfO2), a zirconium oxide layer (ZrO2), an aluminum oxide layer (Al2O3), and/or a lanthanum oxide layer (La2O5).

A metal-containing layer 232 may be formed on the dielectric layer 230. In example embodiments, the metal-containing layer 232 may be formed of a metal nitride.

Figure 11:
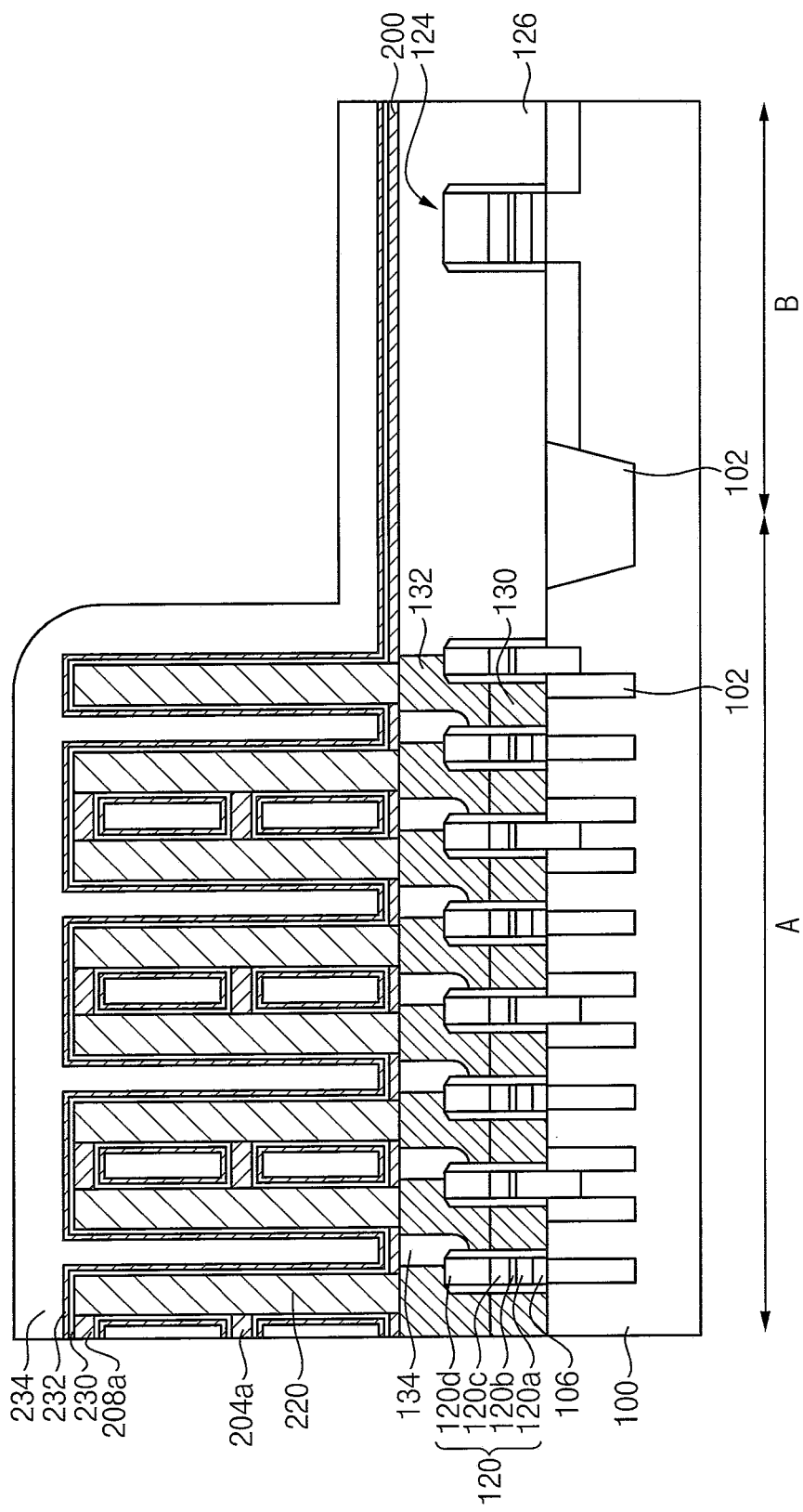

Referring to FIG. 11, a silicon germanium layer 234 may be formed on the metal-containing layer 232. The silicon germanium layer 234 may be doped with P-type impurities or N-type impurities.

In example embodiments, the silicon germanium layer 234 may be formed by an ALD process or a CVD process using a silicon source gas, a germanium source gas, and a dopant gas.

The silicon source gas may include, e.g., silane (SiH4) and/or dichlorosilane (SiH2Cl2). The germanium source gas may include, e.g., germanium (GeH4) and/or germanium tetrachloride (GeCl4). The dopant gas may include, e.g., borane (BH3), boron chloride (BCl3), phosphine (PH3), phosphorus chloride (PCl3), or the like.

Thereafter, a heat treatment process may be performed to crystallize the silicon germanium layer 234. In example embodiments, the heat treatment may be performed at a low temperature of 550° C. or less. If the heat treatment temperature is performed at a high temperature greater than 550° C., then the dielectric layer 230 may deteriorate, which may result in capacitor failure. However, because the heat treatment process of the silicon germanium layer 234 may be performed at a low temperature of 550° C. or less, deterioration of the dielectric layer 30 may be decreased.

It may not be easy to form the metal-containing layer 232 having a generally thick thickness. If the upper electrode is formed using only the metal-containing layer 232 having a generally thin thickness, then the lower electrode 220 may be at least partially exposed in a subsequent etching process for forming the upper contact plug. Therefore, the silicon germanium layer 234 may serve as the upper electrode. Further, the silicon germanium layer 234 may serve as a first buffer layer for decreasing subsequent process defects.

However, the silicon germanium layer 234 may have a high reactivity with respect to a radioactive material in outside air, when, for example, wafers on which the DRAM devices having the silicon germanium layer 234 are manufactured are moved by an airplane. Particularly, as the thickness of the silicon germanium layer 234 is increased, more radioactive materials may be generated in the silicon germanium layer 234. Thus, the DRAM device may have poor reliability. For example, when the silicon germanium layer 234 thickness is greater than 2000 Å, reliability failure may occur.

In example embodiments, the silicon germanium layer 234 may be deposited to have a thickness of less than 2000 Å in a direction perpendicular to a plane formed by the substrate 100. For example, the silicon germanium layer 234 may be formed to have a thickness of about 800 Å to about 1500 Å in some embodiments.

Figure 12:
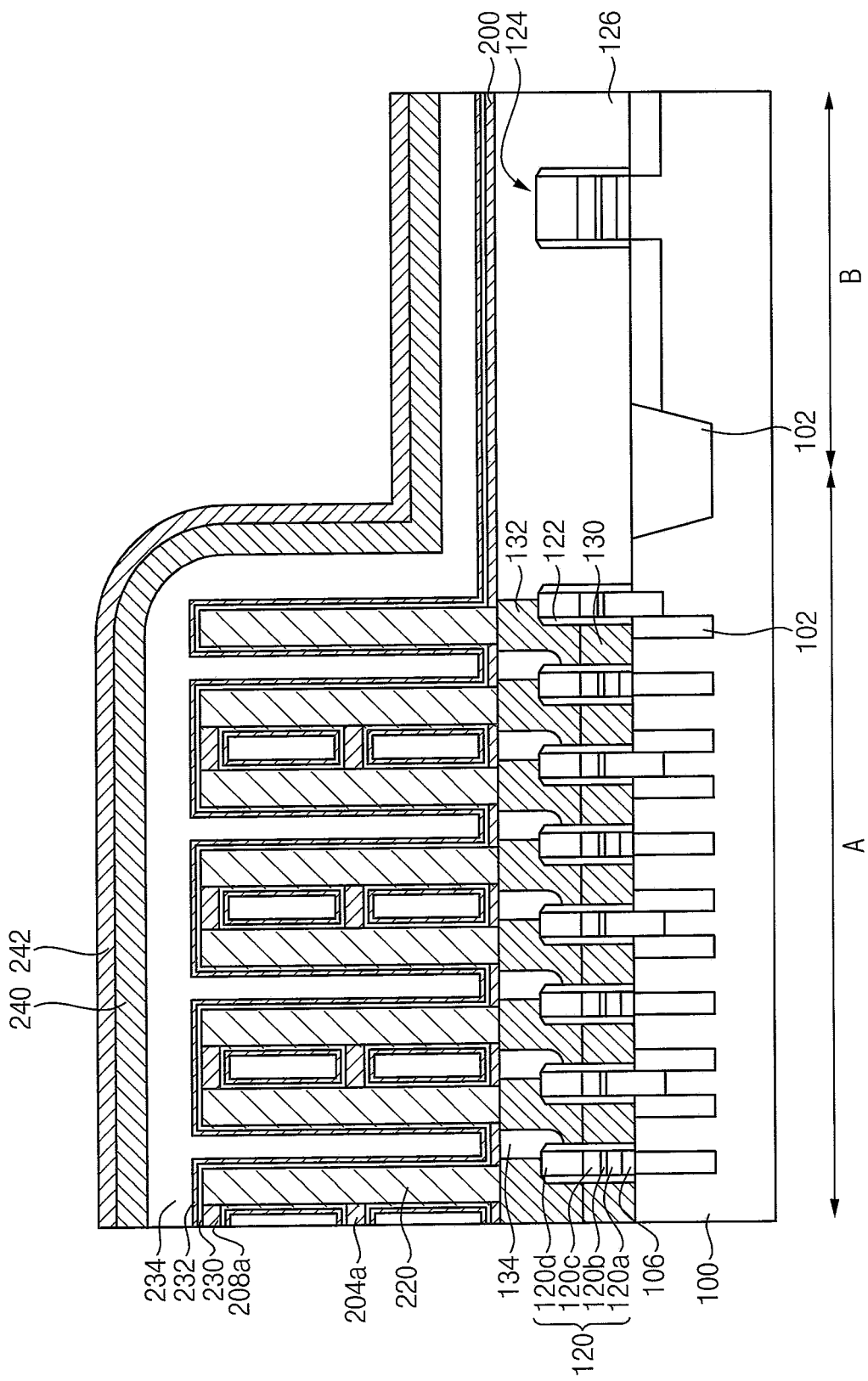

Referring to FIG. 12, a metal plate layer 240 may be formed on the silicon germanium layer 234. In example embodiments, the metal plate layer 240 may include tungsten.

The metal plate layer 240 may serve as a second buffer layer for compensating for a decrease of the thickness of the silicon germanium layer 234. That is, when the silicon germanium layer is formed to have a thickness of less than 2000 Å, defects in the etching process for forming the upper contact plug may not be reduced or prevented by only the silicon germanium layer.

In example embodiments, the metal plate layer 240 may be formed to have a thickness less than the thickness of the silicon germanium layer 234 in a direction perpendicular to a plane formed by the substrate 100. For example, the thickness of the metal plate layer 240 may be less than 70% of the thickness of the silicon germanium layer 234.

A polishing stop layer 242 may be formed on the metal plate layer 240.

The polishing stop layer 242 may include a material that may be used as a polishing stop layer when a subsequent silicon oxide layer is polished. In example embodiments, the polishing stop layer 242 may include silicon oxynitride, silicon nitride, SiCN, or the like.

Figure 13:
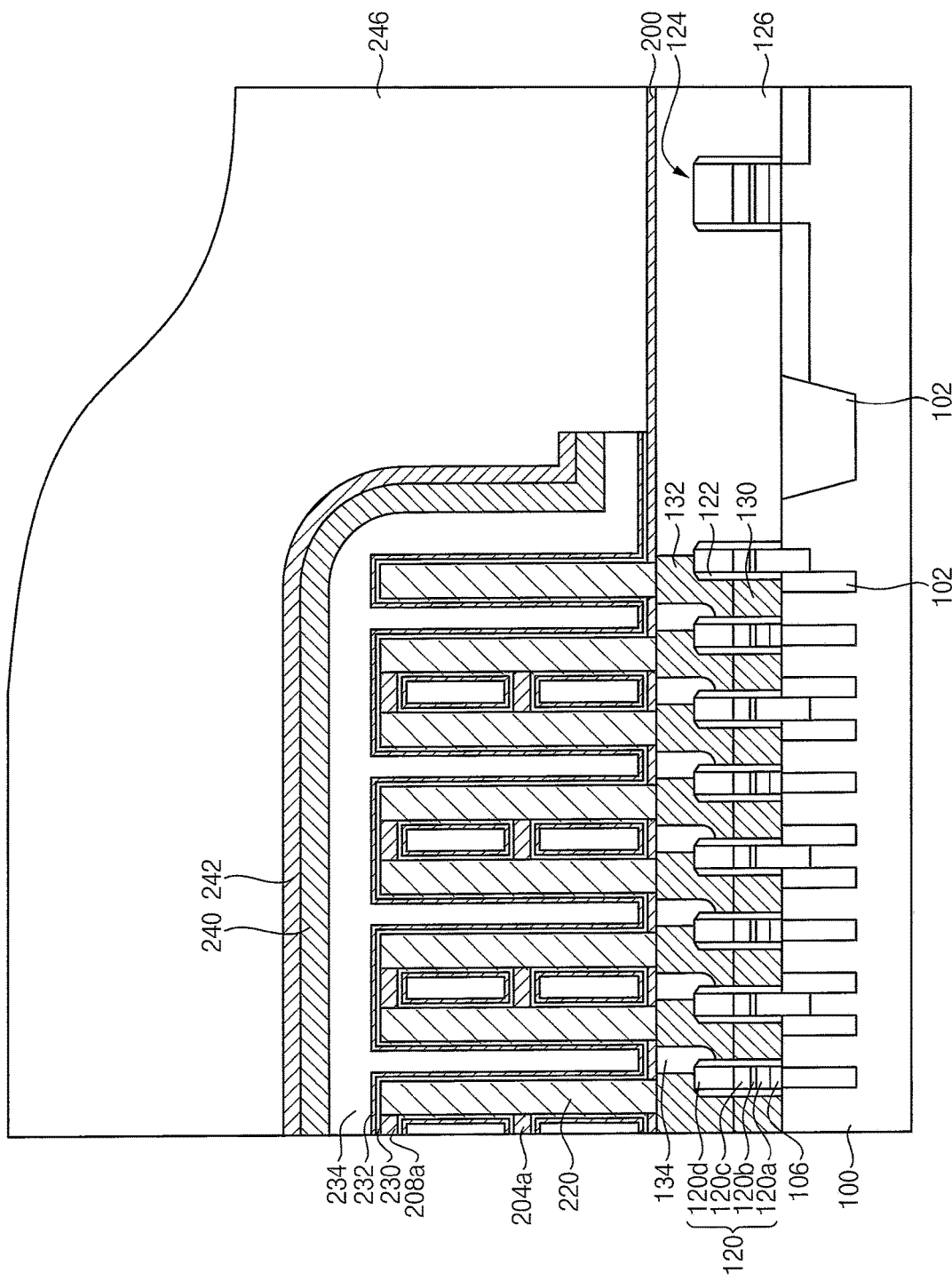

Referring to FIG. 13, a second mask pattern (not shown) may be formed to be on and at least partially cover only the polishing stop layer 242 on the cell region A. The polishing stop layer 242, the metal plate layer 240, the silicon germanium layer 234, the metal-containing layer 232, and the dielectric layer 230 on the peripheral region B may be removed using the second mask pattern as an etch mask. Thus, an upper surface of the etch stop layer 200 may be at least partially exposed in the peripheral region B. After that, the second mask pattern may be removed.

As shown in FIG. 13, the cell region A and the peripheral region B may have a relatively high step difference. For example, a difference between a vertical level of a top surface of the polishing stop layer 242 positioned on the cell region A and a vertical level of a top surface of the etch stop layer 200 positioned on the peripheral region B may be 10000 Å or more.

Thereafter, a second insulating interlayer 246 may be deposited on the polishing stop layer 242 and the etch stop layer 200. The second insulating interlayer 246 may include silicon oxide. A top surface of the second insulating interlayer 246 formed on the peripheral region B may be lower or closer to the substrate 100 than a top surface of the polishing stop layer 242 on the cell region A.

Figure 14:
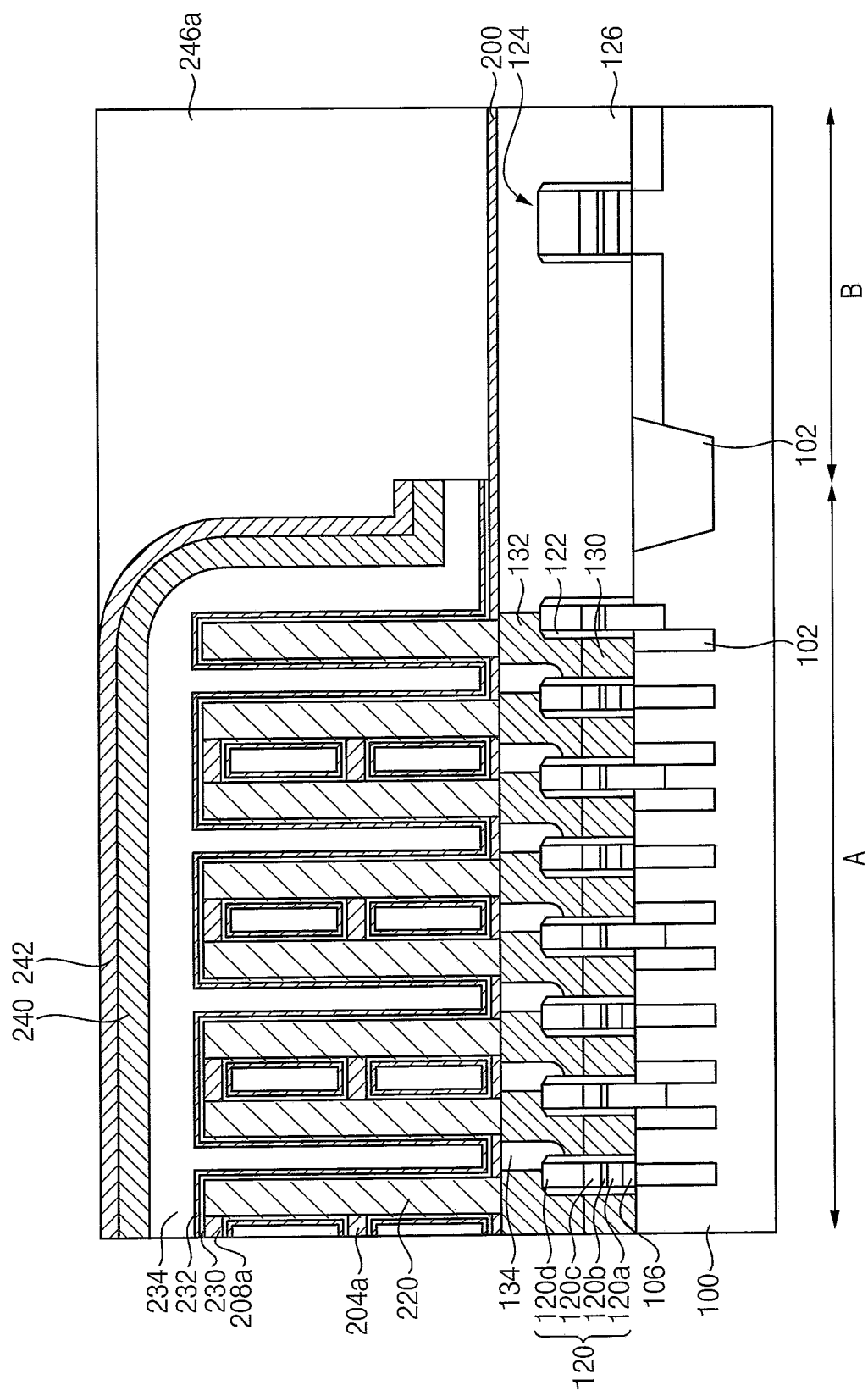

Referring to FIG. 14, an upper surface of the second insulating interlayer 246 may be planarized until a surface of the polishing stop layer 242 is at least partially exposed. The planarization process may include a chemical mechanical polishing process. Thus, the second insulating interlayer 246 on the top surface of the polishing stop layer 242 in the cell region A may be removed, and the second insulating interlayer 246 on the etch stop layer 200 on the peripheral region B may remain.

Because the polishing process is stopped when the polishing stop layer 242 is at least partially exposed, the metal plate layer 240 may not be exposed during the polishing process. Thus, metal contamination of the metal plate layer 240 may be reduced or prevented during the polishing process.

The metal plate layer 240 and the polishing stop layer 242 may be stacked on a top portion of the cell region A.

Figure 15:
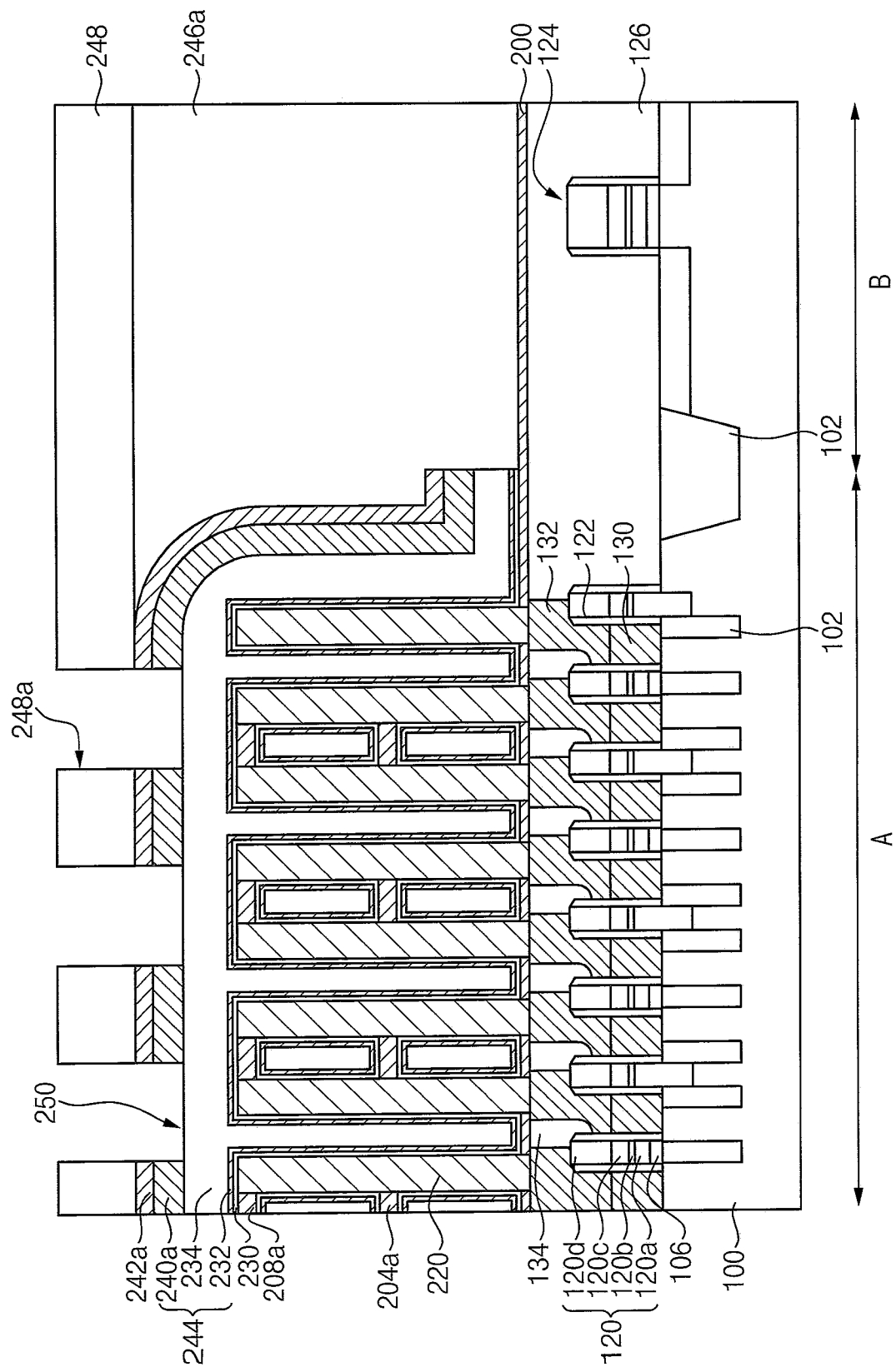

Referring to FIG. 15, a third mask pattern 248 may be formed on the polishing stop layer 242 and the second insulating interlayer pattern 246a.

The third mask pattern 248 on the cell region may include openings 248a at least partially exposing a portion of the polishing stop layer 242. Some of the openings 248a may at least partially expose a portion of the polishing stop layer 242 for forming an upper contact plug electrically connected to an upper electrode subsequently formed. A horizontal area of the opening 248a may be greater than a horizontal area of the upper contact plug, so that the upper contact plug may be formed in the opening 248a.

In example embodiments, the opening 248a included in the third mask pattern 248 may have a hole shape. The holes may be regularly disposed along an entire upper surface of the polishing stop layer 242, and the holes may be spaced apart from each other.

In some example embodiments, the opening 248a included in the third mask pattern 248 may have a line shape. The openings 248a may be regularly disposed along an entire upper surface of the polishing stop layer 242, and the openings 248a may be spaced apart from each other.

The polishing stop layer 242 and the metal plate layer 240 may be sequentially etched using the third mask pattern 248 to form a first opening 250 extending through the polishing stop layer 242 and the metal plate layer 240. In addition, a metal plate pattern 240a and a polishing stop layer pattern 242a may be formed on the silicon germanium layer 234. The metal-containing layer 232, the silicon germanium layer 234, and the metal plate pattern 240a may serve as the upper electrode 244 of the capacitor.

Depending on a shape of the openings 248a included in the third mask pattern 248, a shape of the first openings 250 extending through the polishing stop layer 242 and the metal plate layer 240 may vary.

In example embodiments, as shown in FIG. 16, each of the first openings 250 may have a hole shape, in a plan view.

In example embodiments, as shown in FIG. 17, each of the first openings 250 may have a line shape, in a plan view.

In example embodiments, as shown in FIG. 18, each of the first openings 250 may have a rectangular shape extending in one direction, in a plan view. When the first openings 250 are formed as shown in FIG. 18, the DRAM device shown in FIG. 5 may be manufactured by performing subsequent processes.

After that, the third mask pattern may be removed.

Figure 19:
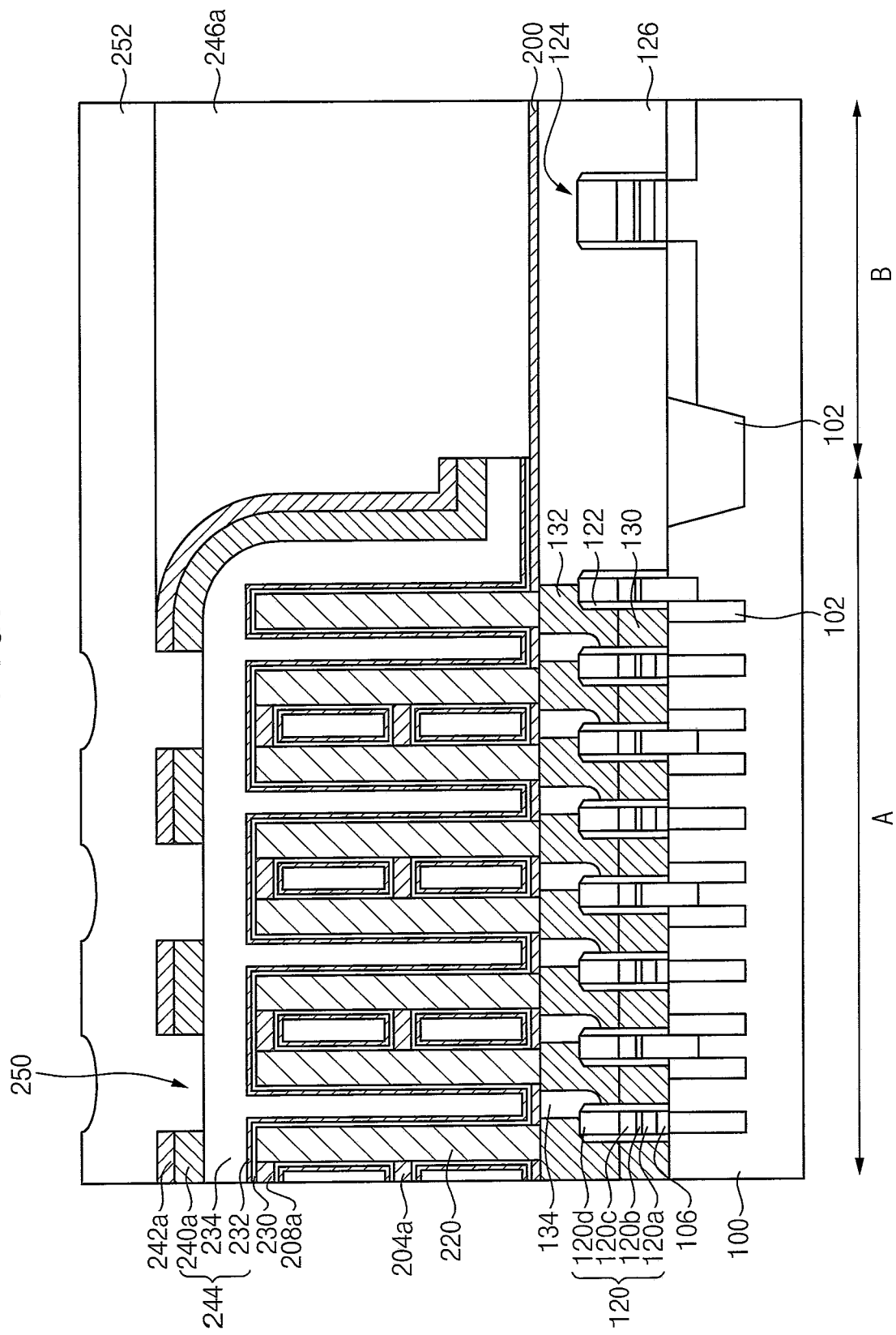

Referring to FIG. 19, a filling insulation layer 252 may be formed on the polishing stop layer pattern 242a and the second insulating interlayer pattern 246a to be in and at least partially fill the first openings 250.

The filling insulation layer 252 may include an insulation material that is configured to facilitate movement of hydrogen ions. The filling insulation layer 252 may include silicon oxide. The filling insulation layer 252 may include a TEOS material.

Figure 20:
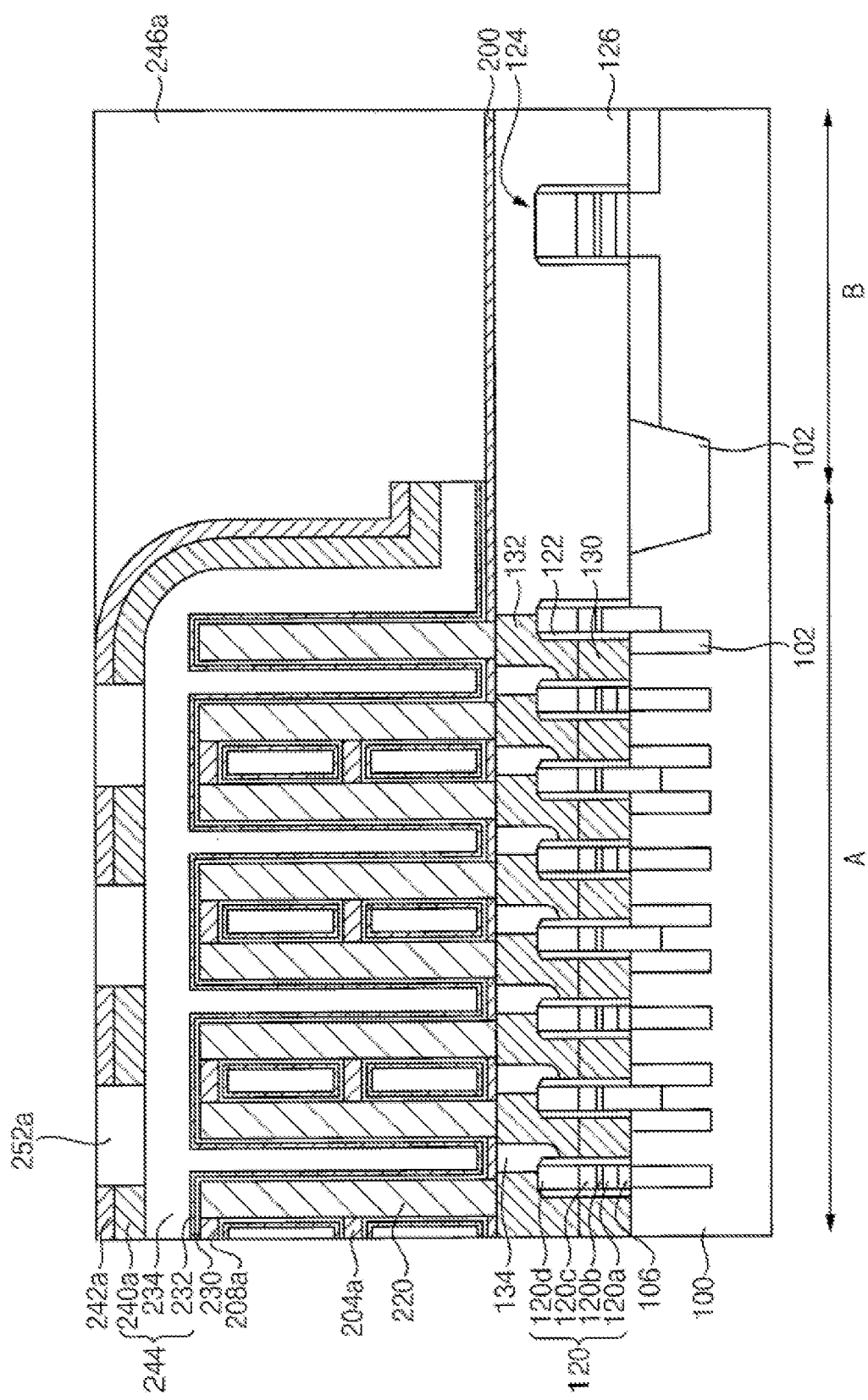

Referring to FIG. 20, the filling insulation layer 252 may be planarized until an upper surface of the polishing stop layer pattern 242a is exposed to form filling insulation patterns 252a. The filling insulation patterns 252a may be formed in the first openings 250, respectively.

Figure 21:
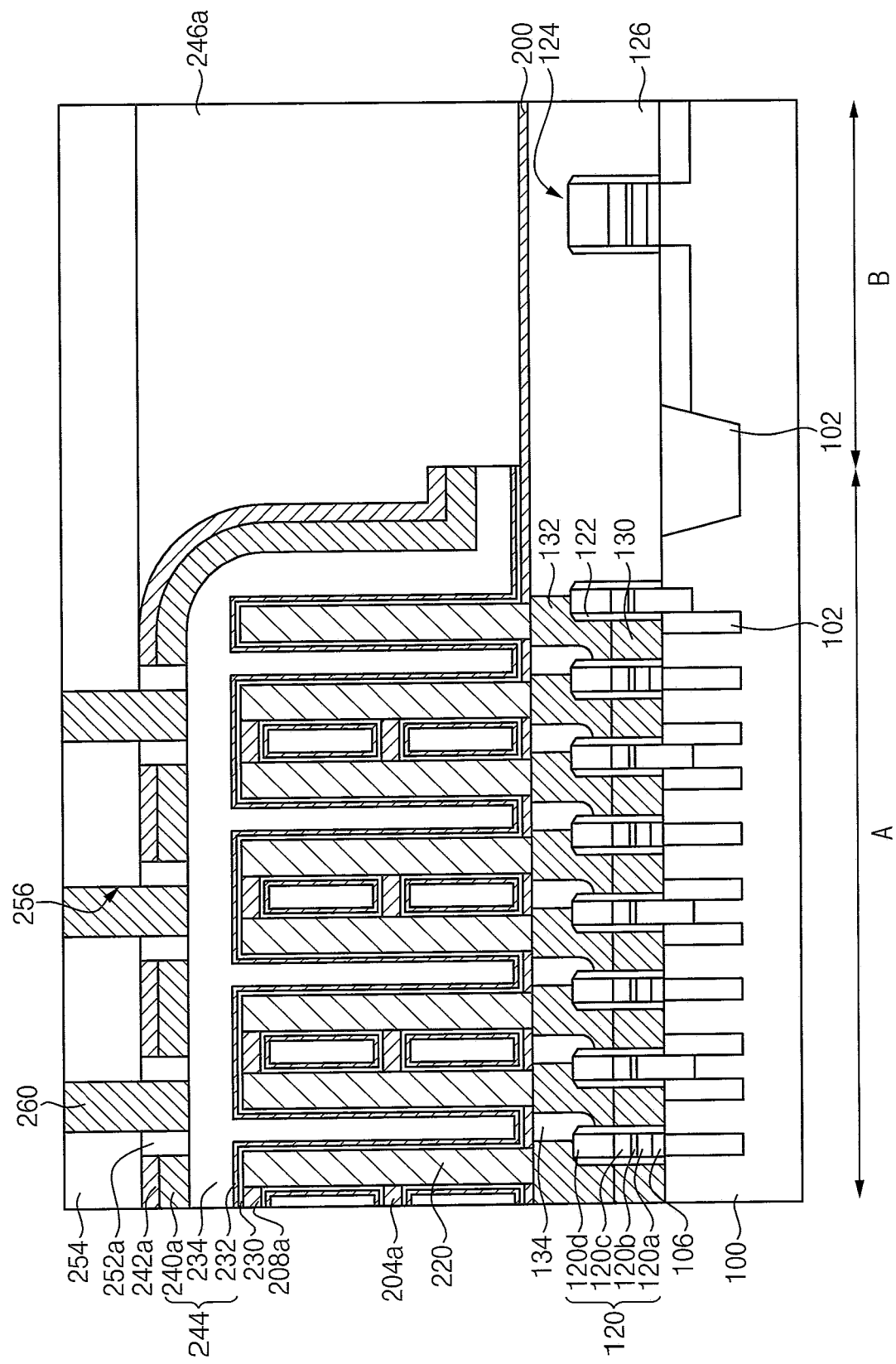

Referring to FIG. 21, a third insulating interlayer 254 may be formed on the filling insulation patterns 252a, the polishing stop layer pattern 242a, and the second insulating interlayer pattern 246a.

The third insulating interlayer 254 may include silicon oxide.

A fourth mask pattern (not shown) including holes may be formed on the third insulating interlayer 254. In the fourth mask pattern, each of holes may be disposed to correspond to one of the first openings. The third insulating interlayer 254 and the filling insulation patterns 252a may be etched using the fourth mask pattern to form contact holes 256 at least partially exposing the upper surface of the silicon germanium layer 234.

The third insulating interlayer 254 and the filling insulation patterns 252a may include silicon oxide, so that the third insulating interlayer 254 and the filling insulation patterns 252a may be etched to form the contact holes 256. That is, during forming contact holes 256, the polishing stop layer pattern 242a and the metal plate pattern 240a may not be etched. The third insulating interlayer 254 and the filling insulation pattern 242a may remain on a sidewall of each of the contact holes 256, and the polishing stop layer pattern 242a and the metal plate pattern 240a may not be exposed by the sidewall of each of the contact holes 256.

A metal layer may be formed to be in and at least partially fill the contact holes 256. The metal layer may be planarized until an upper surface of the third insulating interlayer 254 is exposed to form upper contact plugs. The upper contact plugs 260 may be formed in the contact holes, respectively.

A bottom of the upper contact plug 260 may physically contact the upper surface of the silicon germanium layer 234. Also, a sidewall of the upper contact plug 260 may physically contact the third insulating interlayer 254 and the filling insulation pattern 252a including the silicon oxide.

Referring again to FIG. 2, a fourth insulating interlayer 262 may be formed to be on and at least partially cover upper surfaces of the third insulating interlayer 254 and the upper contact plugs 260. Thereafter, a process of introducing hydrogen ions may be further performed on the fourth insulating interlayer 262.

When the hydrogen ions are introduced, the hydrogen ions may move downward through the upper contact plugs 260.

As described above, the lower sidewalls of the upper contact plugs 260 may not physically contact the polishing stop layer pattern 242a and the metal plate pattern 240a, but may physically contact the filling insulation pattern 252a including silicon oxide. Therefore, the hydrogen ions transferred through the upper contact plugs 260 may move downward without trapping into the polishing stop layer pattern 242a and the metal plate pattern 240a. Accordingly, dangling bonds or trap sites included in the capacitor, the active region of the substrate, or the gate insulation layer may be reduced or removed by the hydrogen ions, and the defects may be reduced or cured.

Figure 22:
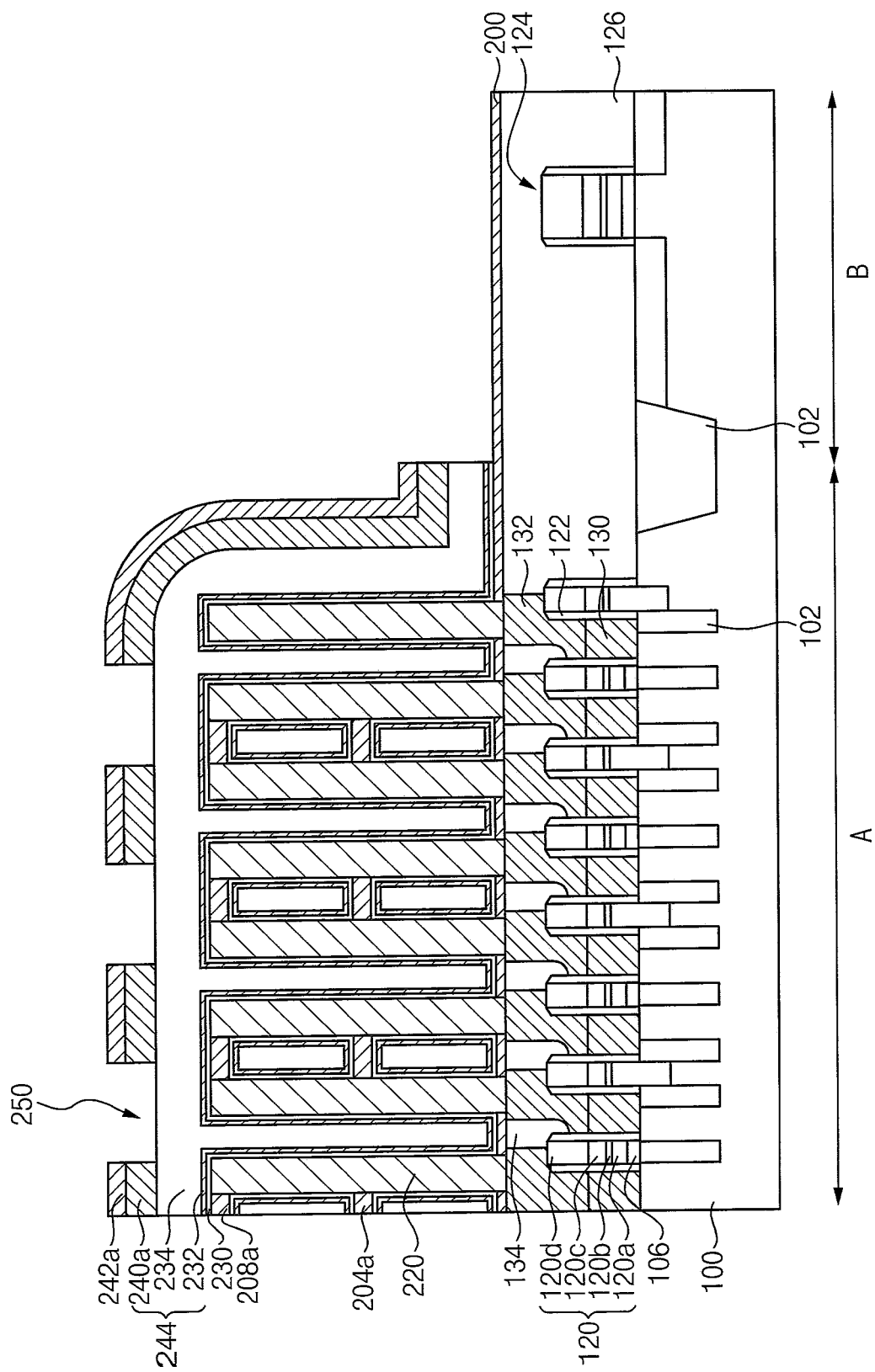
Figure 23:
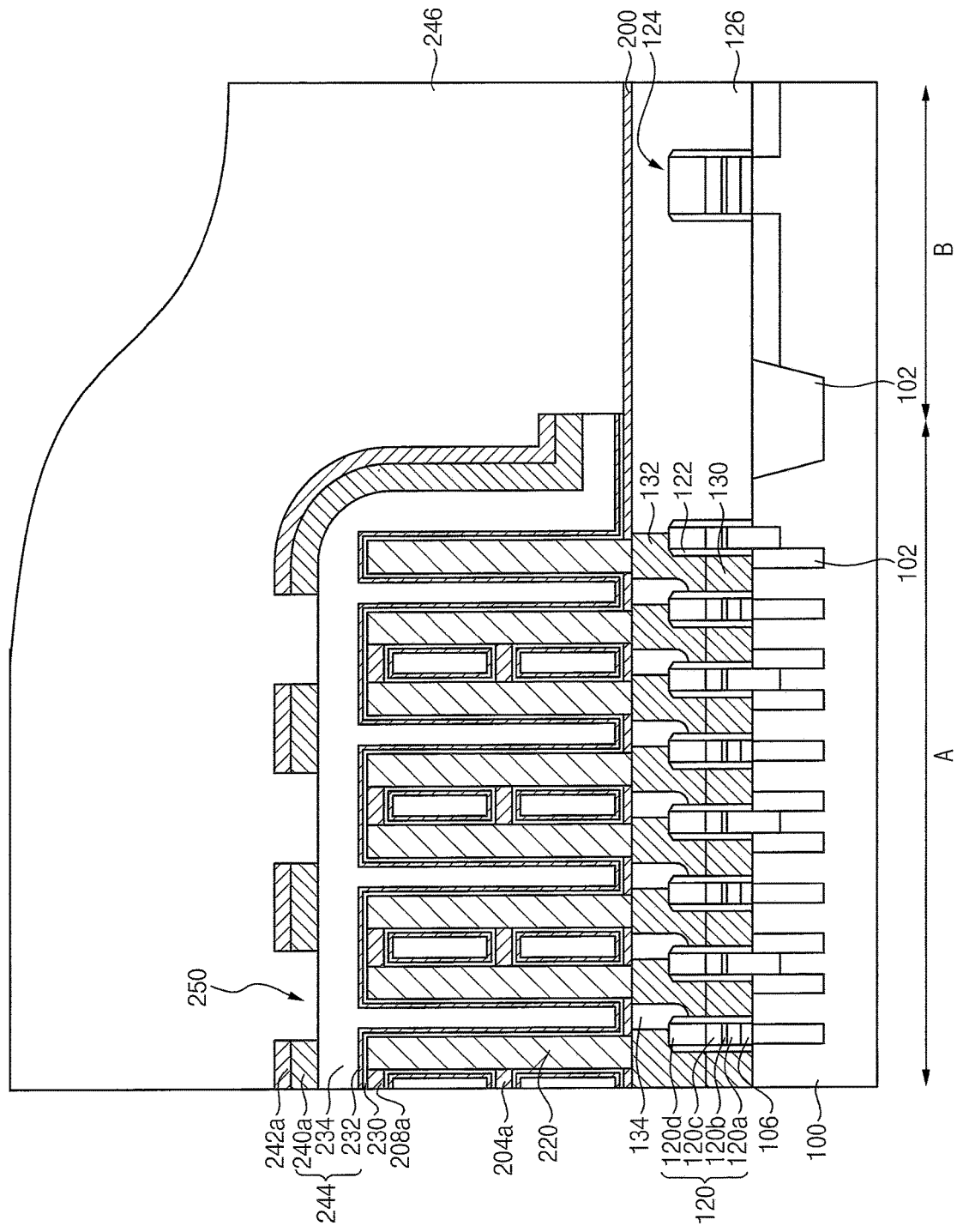
Figure 24:
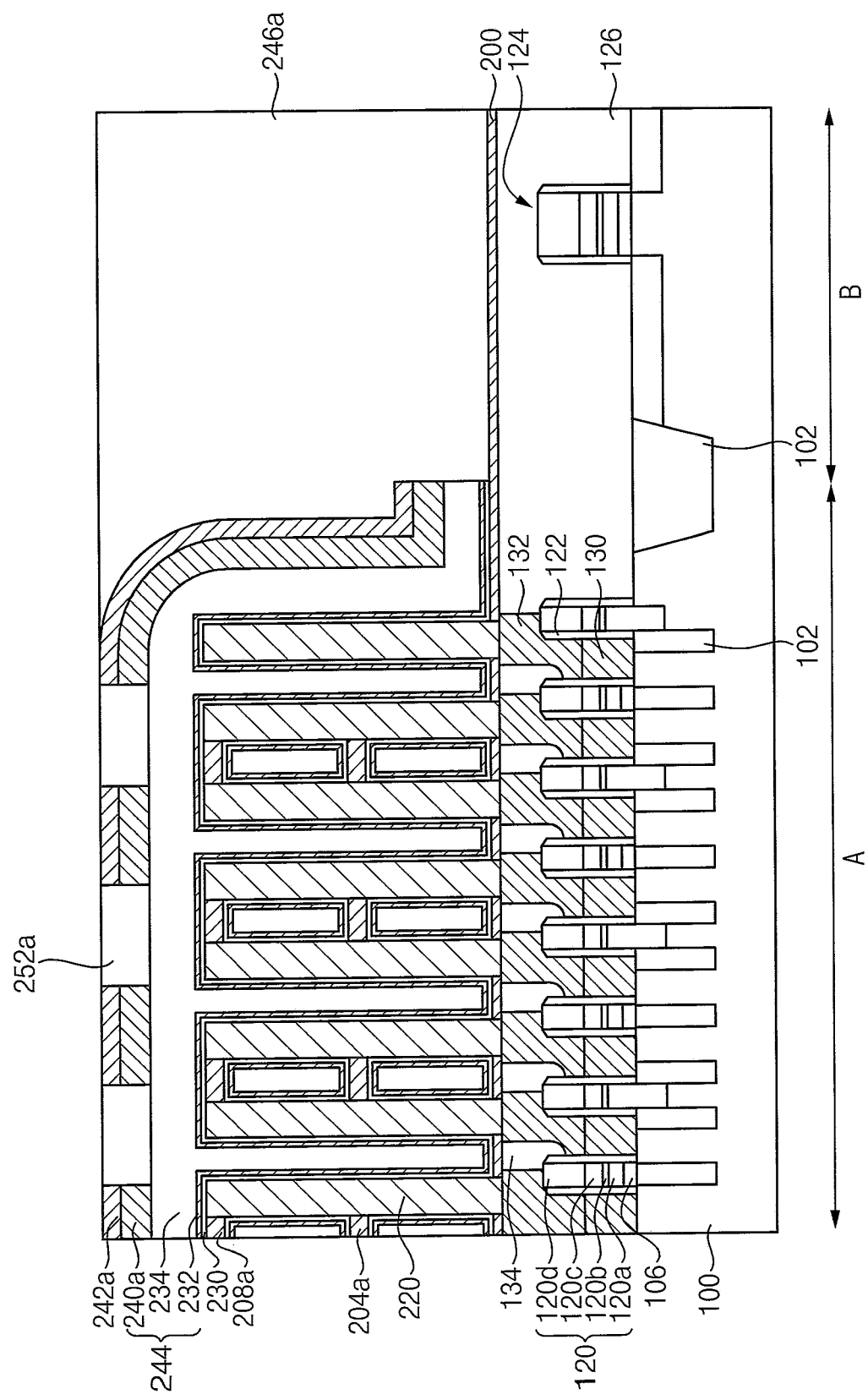

FIGS. 22 to 24 are cross-sectional views illustrating a method of manufacturing a DRAM device in accordance with example embodiments.

Manufacturing processes described below may be the same as or similar to the manufacturing processes described with reference to FIGS. 7 to 21, except for some processes.

First, the structure shown in FIG. 12 may be formed by performing the process described with reference to FIGS. 7 to 12.

Referring to FIG. 22, a first mask pattern (not shown) may be formed to be on and at least partially cover only the polishing stop layer 242 on the cell region A. The polishing stop layer 242, the metal plate layer 240, the silicon germanium layer 234, the metal-containing layer 232, and the dielectric layer 230 on the peripheral region B may be removed using the first mask pattern as an etching mask. Accordingly, an upper surface of the etch stop layer 200 on the peripheral region B may be at least partially exposed.

A second mask pattern (not shown) may be formed on the polishing stop layer 242 and the etch stop layer 200. The second mask pattern may include openings at least partially exposing portions of the polishing stop layer 242 on the cell region.

The polishing stop layer 242 and the metal plate layer 240 may be sequentially etched using the second mask pattern as an etching mask to form the first openings 250 extending through the polishing stop layer 242 and the metal plate layer 240. Accordingly, the metal plate pattern 240a and the polishing stop layer pattern 242a may be formed on the silicon germanium layer 234 in the cell region.

Referring to FIG. 23, a second insulating interlayer 246 may be deposited on the polishing stop layer pattern 242a and the etch stop layer 200. The second insulating interlayer 246 may include silicon oxide. A top surface of the second insulating interlayer 246 on the peripheral region B may be lower or closer to the substrate 100 than a top surface of the polishing stop layer pattern 242a on the cell region A. The second insulating interlayer 246 may be in and at least partially fill the first openings 250.

Referring to FIG. 24, an upper surface of the second insulating interlayer 246 may be planarized until a surface of the polishing stop layer pattern 242a is at least partially exposed. The planarization process may include a chemical mechanical polishing process. Accordingly, filling insulation patterns 252a may be formed in the first openings 250 in the cell region A, and the second insulating interlayer pattern 246a may be formed on the etch stop layer 200 in the peripheral region B.

As described above, the filling insulation pattern 252a and the second insulating interlayer pattern 246a may be formed by the same deposition process.

Because polishing is stopped when the polishing stop layer pattern 242a is exposed, the metal plate layer 240 may not be exposed during the polishing process. Thus, metal contamination of the metal plate layer 240 may be reduced or prevented during the polishing process.

Thereafter, the same process described with reference to FIGS. 21 and 2 may be performed to manufacture a DRAM device having the same structure as that shown in FIG. 2.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a substrate including a cell region and a peripheral region;
a plurality of lower electrodes on the cell region of the substrate;
a dielectric layer on surfaces of the lower electrodes;
a metal containing layer directly on a surface of the dielectric layer, the metal containing layer disposed along the surfaces of the dielectric layer;
at least one support layer pattern between and contacting adjacent lower electrodes of the plurality of lower electrodes;
a silicon germanium layer on the metal containing layer, the silicon germanium layer having a first portion having a flat upper surface and a second portion having a vertical surface positioned at a boundary between the cell region and the peripheral region;
a stacked structure including a metal plate pattern and a polishing stop layer pattern sequentially stacked on the silicon germanium layer, the stacked structure having openings at least partially exposing the flat upper surface of the silicon germanium layer on the cell region, the stacked structure covering the first portion and the second portion of the silicon germanium layer, and the metal plate pattern contacting the silicon germanium layer; and
upper contact plugs physically contacting the first portion of the silicon germanium layer, wherein the upper contact plugs have an uppermost surface farther away from the substrate than an uppermost surface of the stacked structure, wherein the upper contact plugs passing through the opening of the stacked structure, and wherein the upper contact plugs are spaced apart from the stacked structure including the metal plate pattern and the polishing stop layer pattern.

2. The semiconductor device of claim 1,
wherein the stacked structure further comprises filling insulation patterns including silicon oxide in the openings, respectively.

3. The semiconductor device of claim 2, wherein the upper contact plugs extend through the filling insulation patterns.

4. The semiconductor device of claim 2, wherein the filling insulation patterns each have a pillar shape.

5. The semiconductor device of claim 2, further comprising:
a second insulating interlayer on the peripheral region; and
a third insulating interlayer on the polishing stop layer pattern, the filling insulation patterns, and the second insulating interlayer,
wherein the upper contact plugs extend through the third insulating interlayer and the filling insulation patterns.

6. The semiconductor device of claim 1, wherein the silicon germanium layer has a thickness of less than 2000 Å in a direction generally perpendicular to a plane defined by the substrate.

7. The semiconductor device of claim 1, wherein the metal plate pattern includes tungsten.

8. The semiconductor device of claim 1, wherein the metal plate pattern has a thickness less than a thickness of the silicon germanium layer.

9. The semiconductor device of claim 1, wherein the polishing stop layer pattern includes silicon oxynitride, silicon nitride, or SiCN.

10. The semiconductor device of claim 1, further comprising
a cell lower structure including bit line structures, contact plugs, and landing pads on the cell region of the substrate, and
wherein the plurality of lower electrodes are formed on the landing pads, respectively.

11. A semiconductor device, comprising:
a substrate including a cell region and a peripheral region;
a plurality of lower electrodes on the cell region of the substrate;
at least one support layer pattern between and contacting adjacent lower electrodes of the plurality of lower electrodes;
a dielectric layer on surfaces of the lower electrodes and a surface of the at least one support layer pattern;
a metal containing layer directly on a surface of the dielectric layer, the metal containing layer disposed along the surface of the dielectric layer;
a silicon germanium layer on the dielectric layer, the silicon germanium layer including a flat upper surface positioned on the cell region and a vertical surface positioned at a boundary between the cell region and the peripheral region;
a stacked structure including a metal plate pattern and a polishing stop layer pattern sequentially stacked on the silicon germanium layer, the metal plate pattern contacting the silicon germanium layer, the stacked structure including openings at least partially exposing an upper surface of the silicon germanium layer on the cell region, and the stacked structure covering the flat upper surface and the vertical surface of the silicon germanium layer;
filling insulation patterns in the openings, respectively;
upper contact plugs physically contacting the flat upper surface of the silicon germanium layer,
a second insulating interlayer on the peripheral region; and
a third insulating interlayer on the polishing stop layer pattern, the filling insulation patterns, and the second insulating interlayer,
wherein an uppermost surface of the upper contact plugs is higher than an uppermost surface of the stacked structure, and
wherein the upper contact plugs extend through the third insulating interlayer and the filling insulating patterns.

12. The semiconductor device of claim 11, wherein lower sidewalls of the upper contact plugs physically contact the filling insulation patterns, and
wherein the lower sidewalls of the upper contact plugs are spaced apart from the stacked structure including the metal plate pattern and the polishing stop layer pattern.

13. The semiconductor device of claim 11, wherein the filling insulation patterns each have a pillar shape.

14. The semiconductor device of claim 11, wherein the silicon germanium layer has a thickness of less than 2000 Å in a direction generally perpendicular to a plane defined by the substrate.

15. A semiconductor device, comprising:
a substrate including a cell region and a peripheral region;
a cell lower structure including bit line structures, contact plugs, and landing pads on the cell region of the substrate
a plurality of lower electrodes on the landing pads, respectively;
at least one support layer pattern between and contacting two adjacent lower electrodes of the plurality of lower electrodes;
a dielectric layer directly on surfaces of the lower electrodes;
a metal containing layer directly on a surface of the dielectric layer, the metal containing layer disposed along the surface of the dielectric layer;
a silicon germanium layer on the dielectric layer, the silicon germanium layer including a flat upper surface positioned on the cell region and a vertical surface positioned at a boundary between the cell region and the peripheral region;
a stacked structure including a metal plate pattern and a polishing stop layer pattern sequentially stacked on the silicon germanium layer, the metal plate pattern contacting the silicon germanium layer, the stacked structure including openings at least partially exposing an upper surface of the silicon germanium layer on the cell region, and the stacked structure covering the flat upper surface and the vertical surface of the silicon germanium layer;
filling insulation patterns in the openings, respectively;
an insulating interlayer on the polishing stop layer pattern, the filling insulation patterns, and a peripheral region, the insulating interlayer having a flat upper surface;
upper contact plugs extending through the insulating interlayer and the filling insulation patterns, the upper contact plugs physically contacting the flat upper surface of the silicon germanium layer, wherein an uppermost surface of the upper contact plugs is higher than an uppermost surface of the stacked structure.

16. The semiconductor device of claim 15, wherein the insulating interlayer and the filling insulation pattern include silicon oxide, and sidewalls of the upper contact plugs physically contact the insulating interlayer and the filling insulation layer.

17. The semiconductor device of claim 15, wherein the filling insulation patterns each have a pillar shape.

18. The semiconductor device of claim 15, wherein the metal plate pattern has a thickness less than a thickness of the silicon germanium layer.

* * * * *